(12) United States Patent
Javanmard et al.

(10) Patent No.: US 9,981,273 B2
(45) Date of Patent: May 29, 2018

(54) NEGATIVE DIELECTROPHORESIS FOR SELECTIVE ELUTION OF IMMUNO-BOUND PARTICLES

(71) Applicant: THE BOARD OF TRUSTEES OF THE LELAND STANFORD JUNIOR UNIVERSITY, Stanford, CA (US)

(72) Inventors: Mehdi Javanmard, Fremont, CA (US); Sam Emaminejad, Stanford, CA (US); Janine Mok, Palo Alto, CA (US); Michael N. Mindrinos, Menlo Park, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 979 days.

(21) Appl. No.: 14/042,585

(22) Filed: Sep. 30, 2013

(65) Prior Publication Data
US 2014/0102901 A1    Apr. 17, 2014

Related U.S. Application Data

(60) Provisional application No. 61/707,188, filed on Sep. 28, 2012.

(51) Int. Cl.
*B03C 7/02* (2006.01)
*B81B 1/00* (2006.01)
*B03C 5/00* (2006.01)
*B03C 5/02* (2006.01)

(52) U.S. Cl.
CPC .............. *B03C 7/023* (2013.01); *B03C 5/005* (2013.01); *B03C 5/026* (2013.01); *B81B 1/006* (2013.01); *B03C 2201/26* (2013.01)

(58) Field of Classification Search
CPC ................................ B81B 1/006; B03C 7/023
See application file for complete search history.

(56) References Cited

U.S. PATENT DOCUMENTS

| | | | |
|---|---|---|---|
| 7,988,841 B2 | 8/2011 | Scurati et al. | |
| 2002/0058332 A1 | 5/2002 | Quake et al. | |
| 2004/0011650 A1* | 1/2004 | Zenhausern | B01L 3/502746 204/547 |

(Continued)

OTHER PUBLICATIONS

M. Javanmard et al., Use of Negative Dielectrophoresis for Selective Elution of Protein Bound Particles, Anal. Chem., vol. 84, pp. 1432-1438, (2011).*

(Continued)

*Primary Examiner* — Maris R Kessel
(74) *Attorney, Agent, or Firm* — Foley & Lardner LLP; Cliff Z. Liu

(57) ABSTRACT

The procedure of dielectric electrophoresis (dielectrophoresis or DEP) utilizes field-polarized particles that move under the application of positive (attractive) and/or negative (repulsive) applied forces. This invention uses negative dielectric electrophoresis (negative dielectrophoresis or nDEP) within a microchannel separation apparatus to make particles move (detached) or remain stationary (attached). In an embodiment of the present invention, the nDEP force generated was strong enough to detach Ag-Ab (antigen-antibody) bonds, which are in the order of 400 pN (piconewtons) while maintaining the integrity of the system components.

8 Claims, 21 Drawing Sheets

(56) References Cited

U.S. PATENT DOCUMENTS

| | | | |
|---|---|---|---|
| 2006/0177815 A1 | 8/2006 | Soh et al. | |
| 2008/0003142 A1 | 1/2008 | Link et al. | |
| 2008/0014589 A1 | 1/2008 | Link et al. | |
| 2008/0067068 A1 | 3/2008 | Li | |
| 2009/0109441 A1* | 4/2009 | Hartman | G01N 21/1717 356/477 |
| 2009/0218223 A1 | 9/2009 | Manaresi et al. | |
| 2009/0294291 A1 | 12/2009 | Voldman et al. | |
| 2011/0108422 A1* | 5/2011 | Heller | G01N 27/447 204/547 |
| 2012/0085649 A1 | 4/2012 | Sano et al. | |
| 2013/0105317 A1* | 5/2013 | Weber | B03C 5/005 204/451 |

OTHER PUBLICATIONS

B. Y. Shew et al., Enhancement of specific cell-capture efficiency using a reversible dielectrophoresis field, Sensors and Actuators A 163, pp. 128-137 (Aug. 11, 2010) (Year: 2010).*

Javanmard M, et al. "Microfluidic force spectroscopy for characterization of biomolecular interactions with piconewton resolution", Applied Physics Letters, (2010); 97, p. 173704.

Cheng, et al. "A continuous high-throughput bioparticle sorter based on 3D traveling-wave dielectrophoresis," The Royal Society of Chemistry, Lab Chip, Sep. 2, 2009, 9, 3193-3201.

Zhang, "Biopadicle Separation in Microfluidic Devices for in-Line Application" Thesis, Delft University of Technology, Nov. 20, 2009, pp. 1-175.

Tsutsui and Ho, "Cell separation by non-inertial force fields in microfluidic systems" Mechanics Research Communications Nov. 14, 2008, 36: 92-103.

Lewpiriyawong, et al. "Microfluidic Characterization and Continuous Separation of Cells and Particles Using Conducting Poly(dimethyl siloxane) Electrode Induced Alternating Current-Dielectrophoresis" Anal. Chem. Oct. 29, 2011, 83, 9579-9585.

Kang, "On-Chip Separation and Detection of Biological Particles Using Dielectrophoresis and Resistive Pulse Sensing" Dissertation Submitted to the Faculty of the Graduate School of Vanderbilt University, Dec. 2008, pp. 1-186.

Cui, et al., "Separation of particles by pulsed dielectrophoresis" The Royal Society of Chemistry: Lab on a Chip, Jun. 29, 2009, 9, 2306-2312.

Yang, et al. "A multifunctional micro-fluidic system for dielectrophoretic concentration coupled with immuno-capture of low numbers of Listeria monocytogenes" The Royal Society of Chemistry: Lab on a Chip, Jun. 7, 2006, 6, 896-905.

* cited by examiner

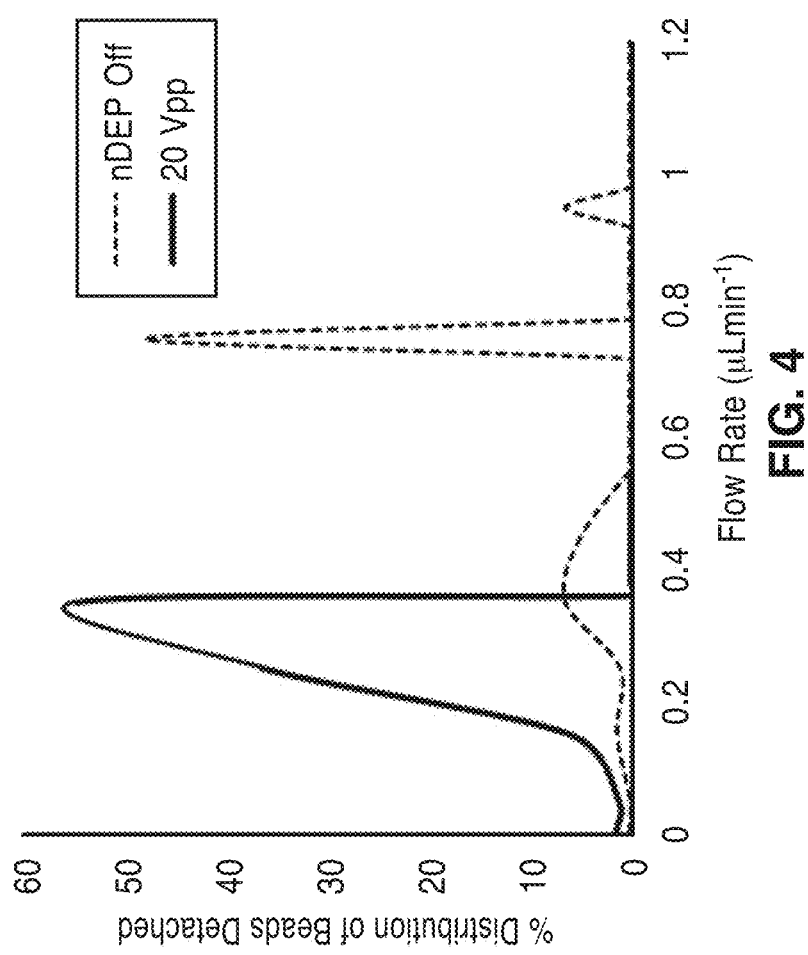

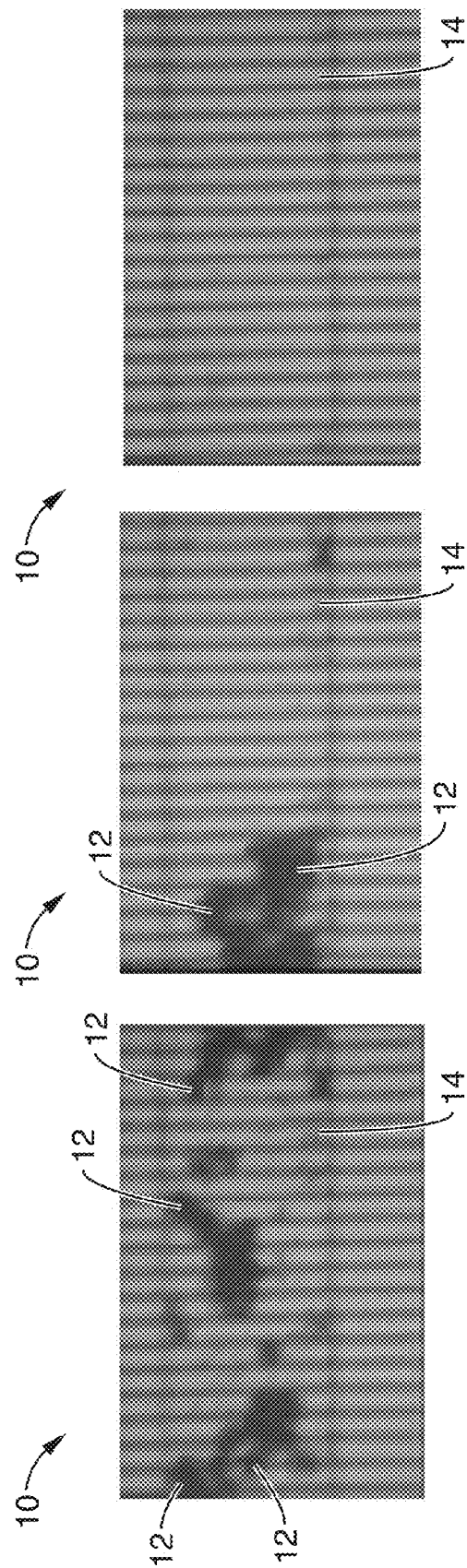

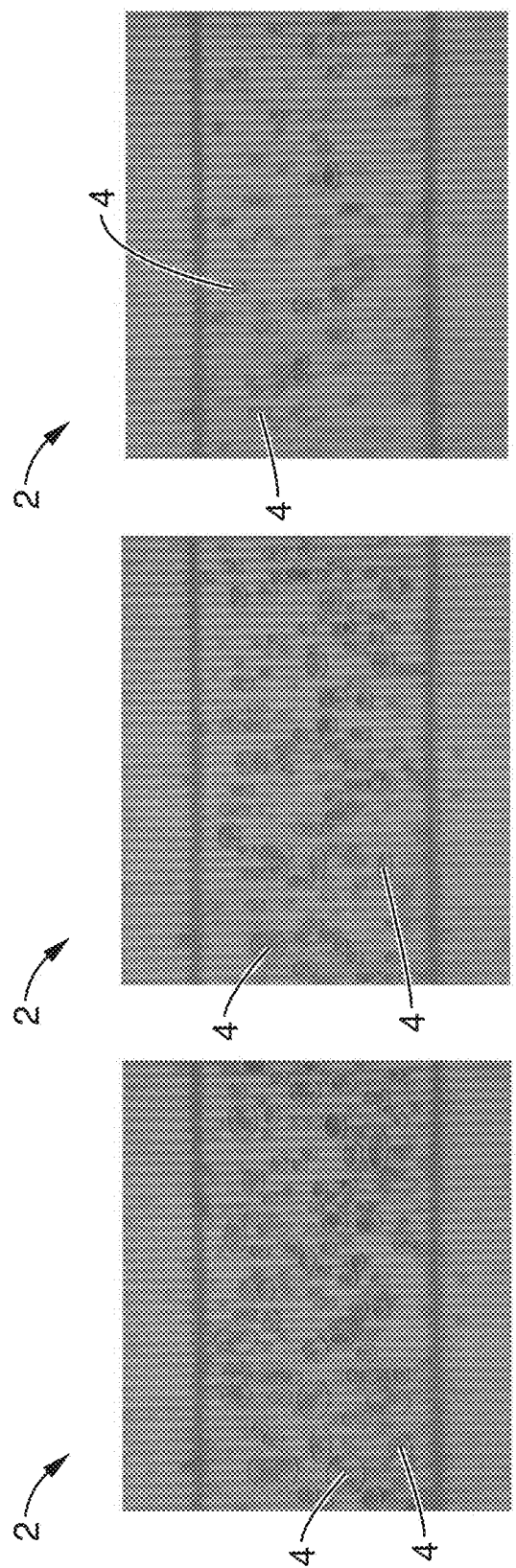

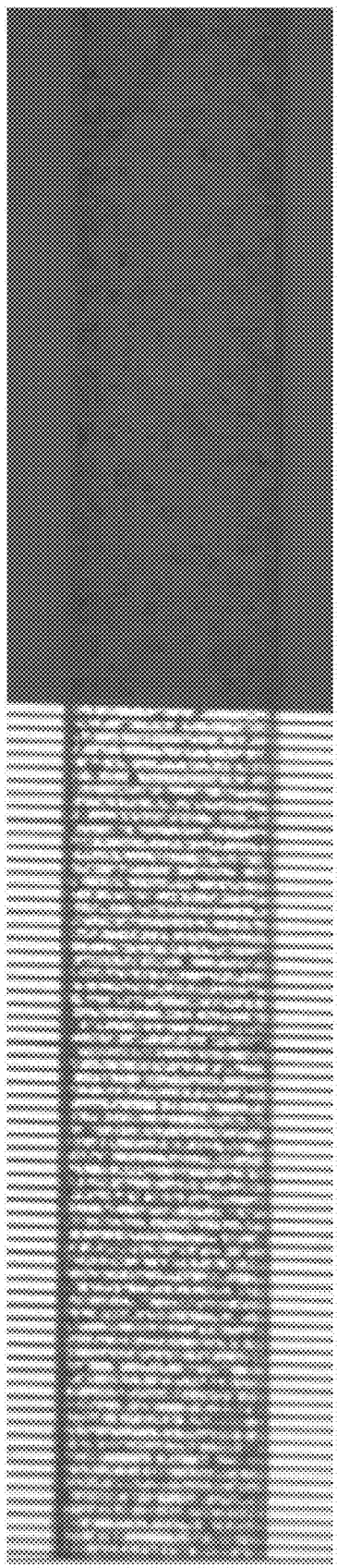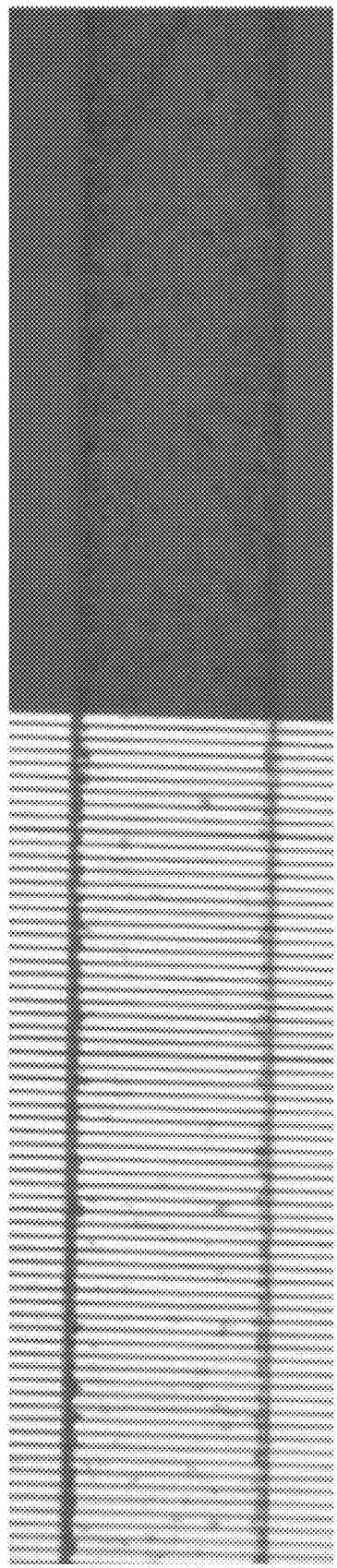

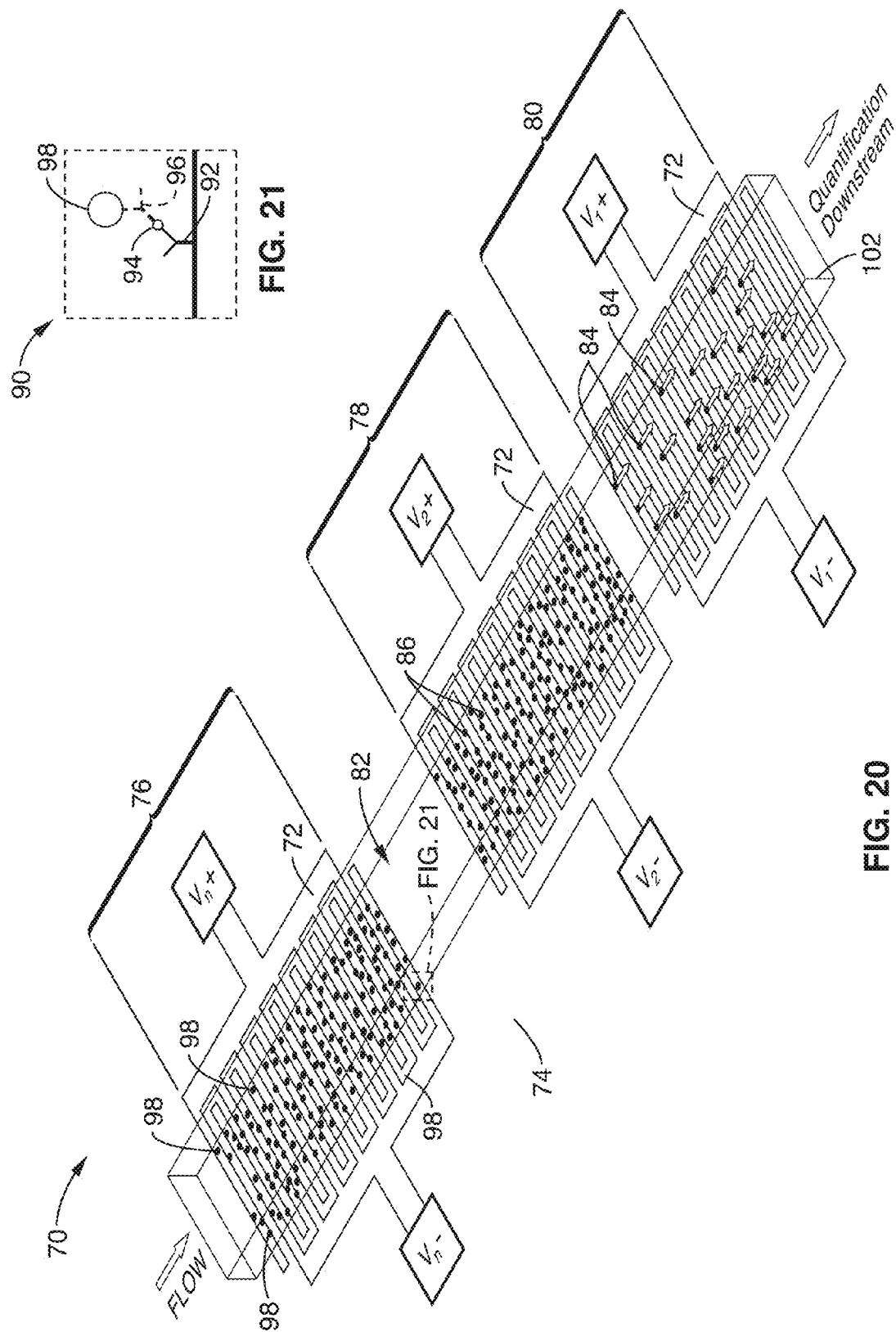

__US 9,981,273 B2__

NEGATIVE DIELECTROPHORESIS FOR SELECTIVE ELUTION OF IMMUNO-BOUND PARTICLES

CROSS-REFERENCE TO RELATED APPLICATIONS

This application is a nonprovisional of U.S. provisional patent application Ser. No. 61/707,188 filed on Sep. 28, 2012, incorporated herein by reference in its entirety.

STATEMENT REGARDING FEDERALLY SPONSORED RESEARCH OR DEVELOPMENT

This invention was made with Government support under Grant No. PO1HG000205 awarded by the National Institutes of Health. The Government has certain rights in this invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

1. Field of the Invention

The subject invention pertains generally to a microchannel particle separation system (and method of operation) that contains different antibodies in different regions of a microchannel. More specifically, the invention relates to using negative dielectric electrophoresis (negative dielectrophoresis or nDEP) within a microchannel separation apparatus to make particles (i.e. beads) move (detached) or remain stationary (attached). When a voltage is turned on to a selected microchannel region, only the beads within that region move while all other beads in the microchannel remain stationary.

2. Description of Related Art

Various electrophoretic-based separation techniques exist in the world of analytical procedures. Many of these techniques utilize the difference in particle size and electrophoretic properties of the particles within a solution to collect and separate particles of interest. This technique can be limiting if you are trying to separate different particles of the same size.

The much less traditional procedure of dielectric electrophoresis (dielectrophoresis or DEP) utilizes field-polarized particles that move under the application of positive (attractive) and/or negative (repulsive) applied forces.

BRIEF SUMMARY OF THE INVENTION

Accordingly, the present invention is directed to a system and methods for selectively eluting different particles within a microchannel by applying nDEP (negative dielectrophoresis) forces to specific regions of the microchannel.

In an embodiment of the present invention, experiments have proved that the nDEP (negative dielectrophoresis) force was strong enough to detach Ag-Ab (antigen-antibody) bonds, which are in the order of 400 pN (piconewtons). The particles (beads in this case) were big enough to allow the nDEP force to move the beads that were not attached too strongly. The use of NaOH at a concentration of 0.2M made the Ag-Ab bonds weaker (on the order of few piconewtons) so that the nDEP force worked to detach the beads. Different Ag-Ab combinations will most likely have different buffer/base concentrations that will be optimal for nDEP to function efficiently.

In another embodiment, with the aid of nDEP in conjunction with shear force, the subject invention has demonstrated a switch-like functionality to elute immuno-bound beads from the inside of a microchannel. At an optimal flow rate, the beads detached when the nDEP fields were turned on, whereas when nDEP was turned off, the beads remained attached. This platform offers the potential for performing a bead-based multiplexed immunoassay where, in a single channel, various regions are functionalized with a different antibody, each targeting a different antigen. As an example and not by limitation, the invention has been demonstrated with the elution of a Protein G-IgG (Protein G-Immunoglobulin G) interaction which is on the same order of magnitude in strength as typical antibody-antigen interactions.

In another embodiment, by increasing the strength of the nDEP force, we demonstrated a significantly improved electrokinetic actuation and switching microsystem that can be used to elute specifically-bound beads from the surface of a microchannel. In this embodiment, using Atomic Layer Deposition, we deposited a nanometer-scale thin film oxide as a protective layer to prevent the electrodes from corrosion when applying high voltages (>20 Vpp) at the electrodes. Then, by exciting the electrodes at high frequency, we capacitively coupled the electrodes to the buffer in order to avoid electric field degradation, and hence, reduction in the nDEP force due to the presence of the insulating oxide layer. To illustrate the functionality of our system, we demonstrated 100% detachment of anti-IgG-IgG (anti Immunoglobulin G antibody-Immunoglobulin G) bound beads (which is in the same order of magnitude in strength as typical antibody-antigen interactions) from the microchannel, upon applying the improved nDEP force (ultra nDEP). The significantly enhanced switching performance presented in this embodiment shows two orders of magnitude of improvement in on-to-off ratios and switching response time, without any need for chemical eluting agents, as compared to other embodiments. The promising results from this work indicates that the functionality of this singleplexed platform can be extended to perform multiplexed bead-based assays where, in a single channel, various regions are functionalized with a different antibody, and beads are immobilized using a different antigen.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 4 is a graph of the percentage distribution of detached beads versus flow rate when 20Vpp is applied as compared to when nDEP is turned off.

FIG. 5A is an image of the microchannel at a flow rate of 0.6 μLmin$^{-1}$ and with nDEP off, showing the beads remain attached to surface.

FIG. 5B is an image of the microchannel immediately after turning nDEP on (20$V_{pp}$) showing that the beads are detaching from the surface and are leaving the channel.

FIG. 5C is an image showing the detached beads have completely left the channel (channel width is 200 μm and the electrode width and spacing are 14 μm and 10 μm, respectively).

FIG. 9A through FIG. 9C is a set of video snapshots of the switching behavior of the subject system for the interaction between anti-IgG and IgG.

FIG. 19A is an image that shows the corresponding raw video snapshot of the bead distribution before turning nDEP on.

FIG. 19B is an image that shows the corresponding raw video snapshot of the bead distribution after turning nDEP on.

FIG. 20 is a schematic diagram of the system in a multiplex embodiment.

FIG. 21 is a schematic diagram of the interaction of a primary antibody bound the interior surface of the microchannel, an antigen, and a secondary antibody bound to a protein covered bead.

DETAILED DESCRIPTION OF THE INVENTION

The present invention is a novel application of negative dielectrophoresis (nDEP) to facilitate particle separation and quantification. Specifically, a microsystem has been developed which provides significantly enhanced DEP resulting from the ability to apply high ac voltages compared to conventional DEP devices which apply inherently weak forces. Accordingly, hereinafter, the forces generated by the subject invention will also be termed ultra nDEP (u-nDEP) where appropriate.

The invention may be better understood with reference to the accompanying examples, which are intended for purposes of illustration only and should not be construed as in any sense limiting the scope of the present invention as defined in the claims appended hereto.

EXAMPLE 1

The Demonstration of Switch-Like Functionality of nDEP in a Singleplex Embodiment A. Overview In the following experiment, nDEP was utilized in conjunction with shear force, which provided the switch-like behavior necessary to achieve the goal of selective particle (beads in this case) elution. At an optimal flow rate, nDEP facilitated bead detachment, whereas when nDEP was off, the beads remained attached. In this embodiment, the ability of nDEP to provide this switching behavior was shown in a singleplex assay.

B. Affinity Between Antigen and Antibody Molecules

Figure 1:
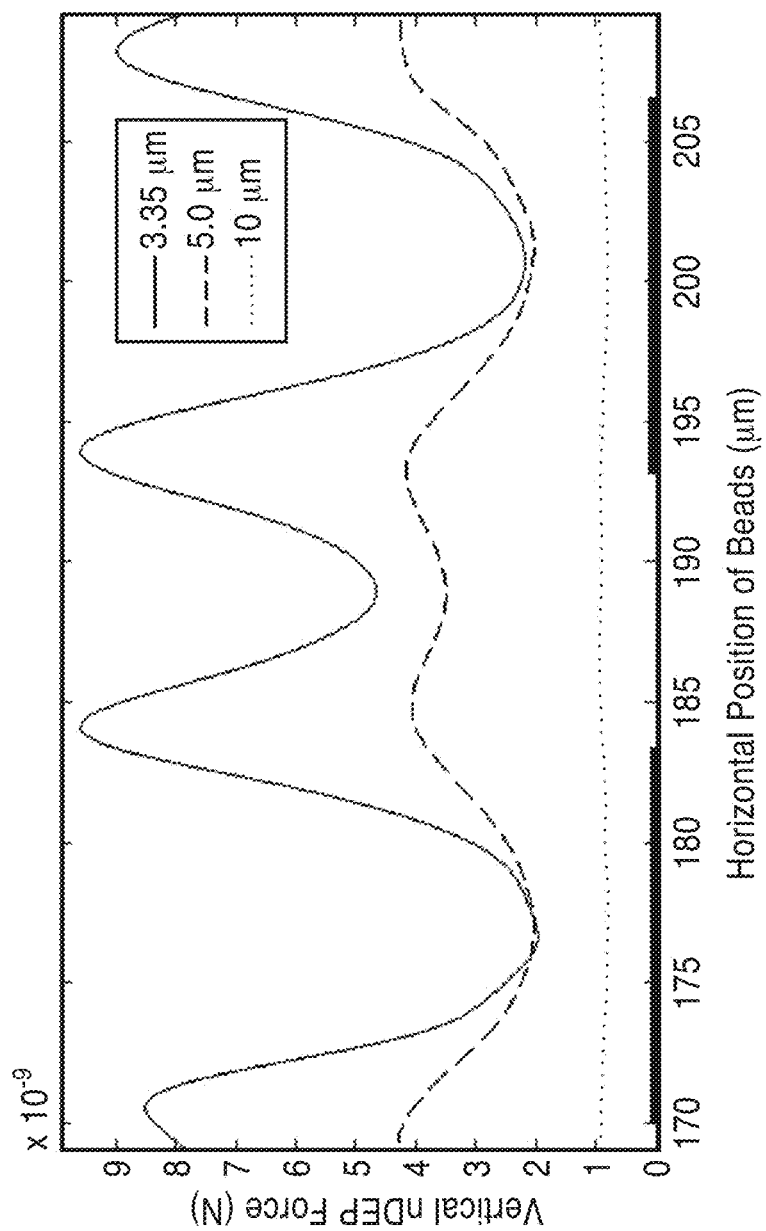
FIG. 1 is a graph of the calculated first order vertical nDEP force at three different heights from the surface of the electrodes to the center of the bead (for 6.7 μm-diameter polystryene bead suspended in buffer with conductivity of 0.13 S/m at 20 $V_{pp}$ and 10 MHz).
Figure 2:
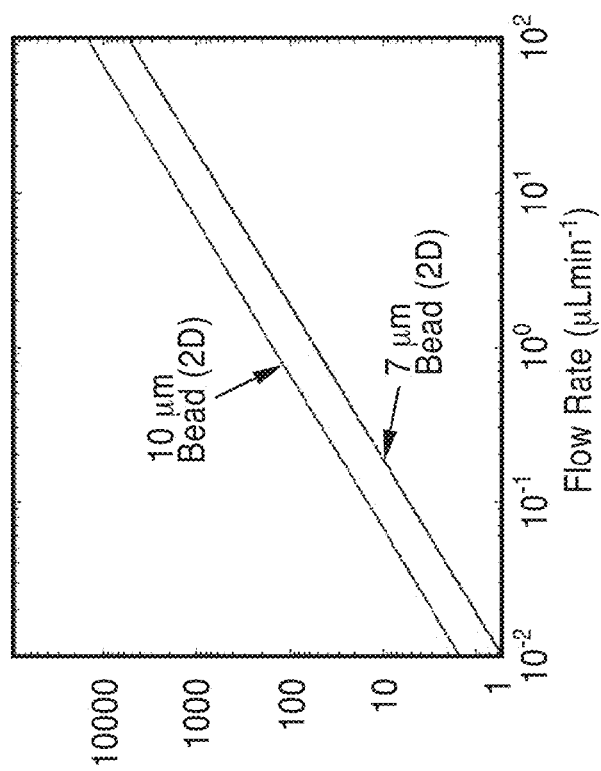
FIG. 2 is a graph of the relationship between channel flow rate and drag force applied to a bead attached to a microchannel surface (simulated with COMSOL).

First order vertical nDEP forces along with the drag force applied to the beads for given flow rates were calculated using COMSOL. FIG. 1 and FIG. 2 illustrate the results. To calculate the nDEP force, the electric field experienced by the particle was computed. Therefore, the non-uniform electric field generated was simulated by the subject design (interdigitated electrodes) using COMSOL, then the nDEP force was calculated accordingly. The calculated first order vertical nDEP force at three different heights from the surface of the electrodes is illustrated by FIG. 1. Since the electrodes were long compared to their width and spacing, the simulation was performed as a 2D model. It was demonstrated that the typical antigen-antibody interactions were on the order of 400 pN. Here, nDEP exerts roughly 1 nN which is sufficient to detach the beads. FIG. 2 shows the relationship between channel flow rate and drag force applied to beads attached to a microchannel surface.

C. Sample Preparation and Microchannel Surface Chemistry

As an example and not by limitation, two different protein interactions were utilized to demonstrate the switch-like functionality in eluting immuno-bound beads from a microchannel surface. The selected interactions were in the same order of magnitude in strength as typical antibody-antigen interactions. The first was a Protein G-IgG (Immunoglobulin G) interaction, and the second was the interaction between anti-IgG (anti-Immunoglobulin G antibodies) and IgG (Immunoglobulin G).

i. Protein G-IgG

To demonstrate the Protein G-IgG elution from the microchannel, we used 6.7 μm-diameter Protein G covered polystyrene beads initially in a 0.5% w/v suspension. 250 μL of this solution was washed with PBS (Phosphate Buffered Saline with a 110 mM NaCl concentration) and was resuspended in 40 μL of PBS to achieve the desired concentration. 4 μL of 1.3 mg/mL Biotinylated rabbit IgG antibody was added to the sample. Next, the room temperature solution was placed in the rotator for 45 minutes to rotate at 36 rotations/minute. The beads were then extensively washed with PBS and 0.01% Tween (2000:1). At this point, 5 μL Streptavidin was added to the solution, and the sample was once again placed in the rotator for 45 minutes to rotate at 36 rotations/min. Finally, the beads were washed again with PBS and Tween and were resuspended in 40 μL of PBS and Tween. For the control experiment to test for the specificity of bindings, a separate sample was prepared following the above steps, except for the addition of Streptavidin, to eliminate the link between the Biotin on the sample beads and the Biotin on the surface. This effectively eliminated the possibility of the attachment of beads to the microchannel surface through specific-bindings.

To prepare the channel surface for the Protein G-IgG interaction, the device with an electrode width of 14 μm and spacing of 10 μm was used. Biotinylated BSA (BBSA) was physically adsorbed on the channel surface, by first injecting PBS/Tween/BBSA (9:0.0045:1) in the channel and allowing for the solution to incubate for 20 minutes. This was followed by introducing 3% non-fat milk with Tween in the channel to cover the regions of the surface that were not covered by BBSA, and hence to eliminate non-specific binding (attachment of beads to the gold surface of the electrodes). The channel was then flushed and filled with PBS and Tween (2000:1) as the channel buffer.

ii. Anti-IgG-IgG

To demonstrate the interaction between anti-IgG and IgG, 7.4 μm-diameter goat anti-mouse IgG covered polystyrene beads (initially in 0.5% w/v suspension) were used. 250 μL of this solution was washed with PBS and Tween similar to the previous preparation and then the beads were resuspended in 80 μL of PBS and Tween.

To prepare the channel surface for this interaction, the device with electrode width and spacing of 7 μm was used. Mouse IgG (originally 2 mg/mL, diluted by ×100) was pipetted in and physically adsorbed on the channel surface, by allowing for the solution to incubate for 20 minutes. This was followed by introducing BSA in the channel to eliminate non-specific bindings. The channel was then flushed and filled with PBS and Tween similar to the previous preparation. For the control experiment to test for the specificity of binding, on a separate chip the above steps were performed to prepare the surface, except for the addition of IgG, which effectively eliminated the possibility of attachment of beads to the surface of the microchannel through specific-binding.

D. General Experiment Setup and Experimental Procedure

We used a function generator (Agilent 33220A) to provide electrical excitation to the device. This device was used as an example means for generating the desired electric field in the microchannel. Electrodes were excited with sine wave at 10 MHz. A syringe pump (Harvard Apparatus) was used to control the flow rate through the device.

We first flushed the channel with PBS and Tween to eliminate the air bubbles. Then, the prepared sample beads were injected into the channel by directly pipetting them into the inlet well. The syringe was attached to Tygon™ tubing which was connected to the outlet well. Negative pressure was applied to the syringe to pull the solution. The flow was controlled with the aid of a syringe and the syringe pump. The beads were allowed to settle for 15 minutes so that they had sufficient time to bind to the surface.

For each experiment, the flow rate and hence drag force was increased gradually until all beads detached at an applied voltage level. Applying voltage to the electrodes resulted in establishing a non-uniform electric field necessary to produce nDEP force. The upward nDEP force caused the immuno-bound beads to be pushed away from the gold electrode region, and eventually at the proper flow rate, to be detached fully. At each flow rate, we quantified the percentage of detached beads relative to total number of initially captured beads (at rest).

E. Results for Protein G-IgG Interactions

To verify the usefulness of the subject invention, we demonstrated the elution of a Protein G-IgG interaction which is in the same order of magnitude in strength as typical antibody-antigen interactions. Polystyrene protein G coated beads (6.7 μm-diameter) were first conjugated to biotinylated anti-IgG and then streptavidin. Biotinylated BSA was physically adsorbed on the channel surface. The beads were incubated in the channel such that they bound to the microchannel surface around the gold electrodes. For each experiment, flow rate was increased gradually until all beads detached. At each flow rate, we quantified the percentage of detached beads relative to total number of initially captured beads (at rest).

Figure 3:
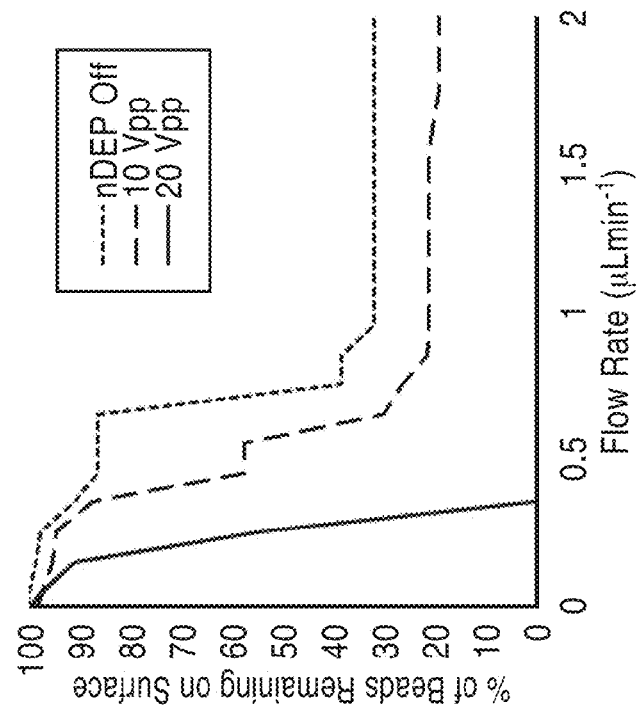
FIG. 3 shows a graph of the percentage of beads remaining on the microchannel surface with the buffer for washing the beads being phosphate buffer saline with a salt concentration of 110 mM NaCl.

Representative results are shown in FIG. 3 for the three voltages, 0 V (nDEP-off), 10 Vpp and 20 Vpp (10 MHz). For 20 Vpp, all beads detached as the flow rate reached 0.35 μLmin$^{-1}$, whereas when DEP was off, more than 90% of the beads remained attached. With nDEP off, the flow rate had to be increased to 0.95 μLmin$^{-1}$ in order to remove the majority (70%) of the beads.

Therefore, the flow rate range within which switch-like behavior necessary for detachment of immuno-bound beads can be exhibited is between approximately 0.4 to 0.6 µLmin$^{-1}$. The switching behavior of the present system is visualized in FIG. 4, which shows the percentage distribution of beads detached at a given flow rate. To verify this behavior, flow rate was set to 0.6 µLmin$^{-1}$ and allowed to run for 2 minutes with the nDEP field turned off. Immediately afterwards, nDEP was turned on (20 Vpp) resulting in detachment of all of the bound beads. FIG. 5A shows an image 10 of the beads 12 remaining attached to the surface of the channel 14 at a flow rate of 0.6 µLmin$^{-1}$ with nDEP turned off. FIG. 5B shows the image 10 of the channel surface 14 immediately after turning nDEP on (20 Vpp). Here, beads 12 become detached from the surface and are leaving the channel. FIG. 5C shows the detached beads 12 completely leave the channel (channel width: 200 µm, electrodes width and spacing: 14 and 10 µm).

This prototype and experiment demonstrates the ability of nDEP to elute immuno-bound beads with a switch-like behavior. We used nDEP in conjunction with shear force to illustrate this behavior in a singleplex assay. At an optimal flow rate, nDEP turned on results in bead detachment, whereas when nDEP was off, the beads remained attached. The results shown above on a singleplex assay can be extended to the multiplex format by patterning multiple sets of electrodes with different probe antibodies on the surface, as shown in FIG. 20 and FIG. 21.

F. Influence of Base Concentration on Particle Elution

Figure 6:
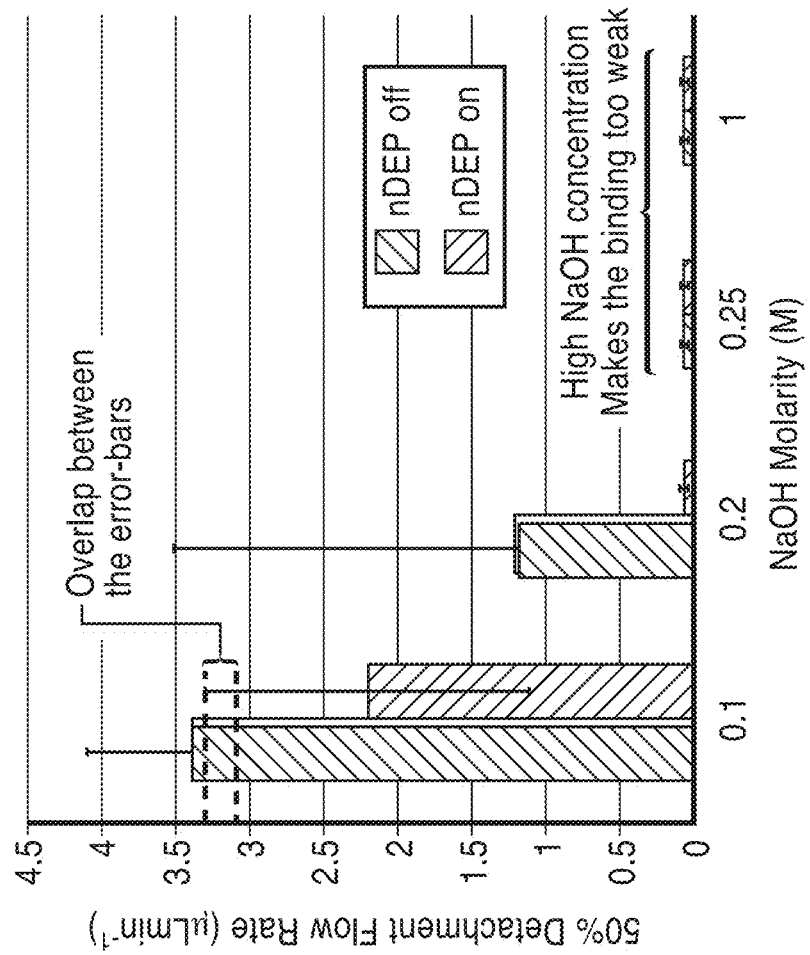
FIG. 6 is a graph showing the influence of base concentration with the on/off state of nDEP and the detachment of particles.

FIG. 6 illustrates the discovered relationship between base (NaOH or equivalent base) concentration and retention and release of particles from the channel surface. For the anti-IgG-IgG interaction, we experimented with the NaOH concentration of the buffer as one of the contributing factors in determining the strength of anti-IgG-IgG binding. This was done by varying the concentration of sodium hydroxide (NaOH) in the washing step. Here, the binding of the anti-mouse IgG beads to the mouse IgG coated surface was done in PBS. After sufficient binding occurred, we injected varying concentrations of NaOH at a controlled flow rate. Our goal was to establish an optimal NaOH concentration for the buffer to facilitate the desired switch-like functionality. Ideally, NaOH concentration had to be sufficiently high to weaken the anti-IgG-IgG bonds and enable the elution of the bound beads from the channel surface when applying a force that is on the same order of magnitude as nDEP. On the other hand, the NaOH concentration could not be too high, as it would make the anti-IgG-IgG bonds too weak to allow the beads to stay attached to the channel surface in the absence of the flow (drag force) or nDEP, preventing us from proceeding with the experiment.

Figure 8:
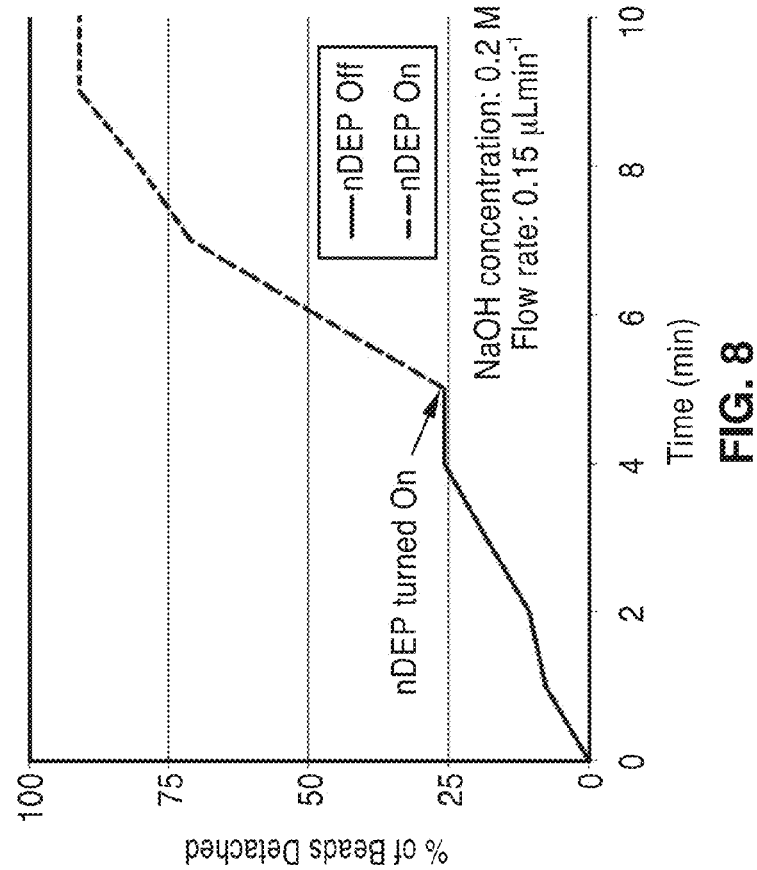
FIG. 8 is also a graph illustrating with data plots the switching behavior of the subject system for the interaction between anti-IgG and IgG.
Figure 7:
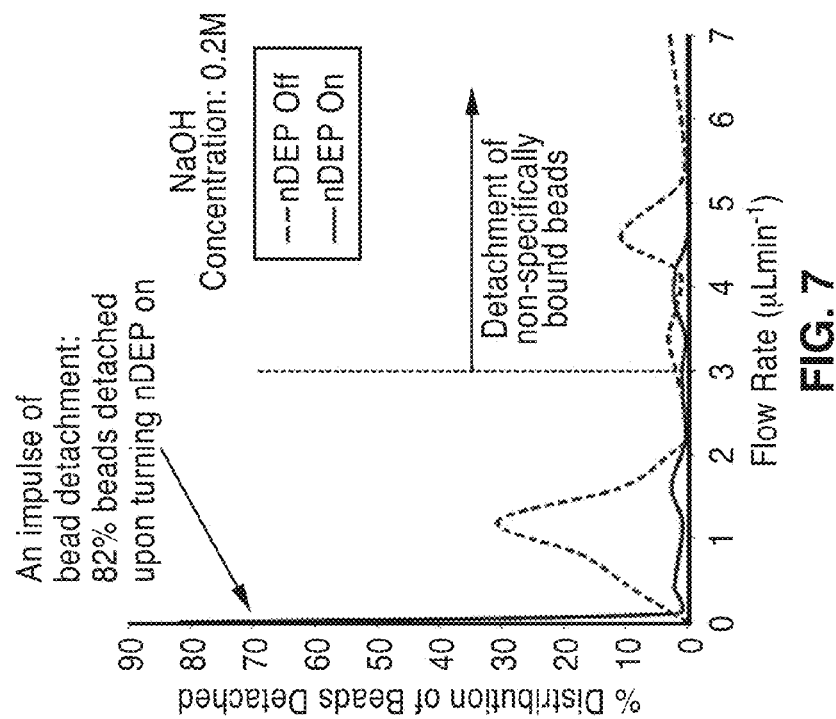
FIG. 7 is a graph illustrating with data plots the switching behavior of the subject system for the interaction between anti-IgG and IgG.

FIG. 7 shows a plot of the percentage distribution of detached beads at a NaOH concentration of 0.2 M. Upon turning nDEP on, about 80% of beads became detached. Detachment of beads at a rate higher than 3 µLmin$^{-1}$ is due to elution of non-specifically bound beads (verified by the control experiment). FIG. 8 shows a bead detachment time profile at a flow rate of 0.15 µLmin$^{-1}$ and a NaOH concentration of 0.2 M.

Again, the switching behavior of the subject system for the interaction between anti-IgG and IgG can be visualized in FIG. 7, which shows the percentage distribution of beads detached at a given flow rate and at the optimal NaOH concentration of 0.2 M. The corresponding control experiment showed some non-specific binding of the beads to the electrodes in the channel surface in the absence of the IgG. Those non-specifically bound beads were eluted at flow rates higher than 3 µLmin$^{-1}$ for NaOH concentration of 0.2 M. We believe that the small bumps that can be observed in the detachment distributions at a rate higher than 3 µLmin$^{-1}$ are a result of elution of such non-specifically bound beads. This in turn shows another advantage of the present invention, which allows for distinction of non-specifically bound beads and only detaches the beads that were specifically bound to the surface as a result of the interaction between anti-IgG and IgG. The major detachment peaks for both nDEP on and off occurred at flow rates less than 3 µLmin$^{-1}$.

To further verify the switch-like behavior, at the NaOH concentration of 0.2 M, the flow rate was set to 0.15 µLmin$^{-1}$ and allowed to run for a total of 10 minutes. nDEP was turned on (20 Vpp) at the end of the 5th minute. FIG. 8 illustrates the bead detachment time profile for this process. As flow is applied, beads slowly become detached and the releasing finally levels off after 4 minutes. At the end of the 5th minute, once the nDEP is turned on, the detachment of beads is reinitiated. The corresponding captured snapshots from the video recorded experiment are shown in FIG. 9A through FIG. 9C. These corresponding images 2 show the bead distribution within the channel when nDEP is off and then turned on. The beads can be seen as grey spots 4. FIG. 9A shows the initial state of the channel. FIG. 9B is an image showing the channel interior surface immediately before turning nDEP on (5th minute) and FIG. 9C shows the distribution of beads bound to the channel surface after 10 minutes (i.e. nDEP was on for 5 minutes). As can be seen from the results, the rate of the bead detachment increased by a factor of 3.6 upon turning nDEP on, resulting in the total elution of 90% of the originally attached beads at the end of the 10th minute.

EXAMPLE 2

Improved nDEP (Ultra nDEP) Using an Oxide Layer

A. Introduction

Previously, we demonstrated a switch-like functionality to elute specifically bound beads from the surface of a microchannel utilizing negative dielectrophoresis (nDEP) force in conjunction with shear force, at an optimal sodium hydroxide concentration (NaOH). The nDEP force was established by applying an AC voltage at an interdigitated electrode pair. The role of the NaOH (at an optimal concentration) was to sufficiently weaken molecular binding such that the nDEP force would be able to push the specifically-bound beads off of the surface, yet not too weak, so beads would remain firmly bound to the surface at the flow rate of operation when nDEP was off.

While the use of NaOH allowed for establishing the switching functionality of nDEP as a proof of concept, its use is not desirable for the purpose of performing a multiplexed assay along a single channel. In the multiplexed setting, the optimal NaOH concentration for each interaction may be different and there may be no overlap of practical range of NaOH concentrations for all interactions. For instance, the lowest NaOH concentration needed to help nDEP facilitate detaching the bound beads for one interaction may already be too strong for another interaction along the array and may undesirably result in detachment of those bound beads with nDEP off in that region of the microchannel.

To resolve this issue and eliminate the need for NaOH, the nDEP force must be increased significantly. The increase in the strength of the nDEP force enhances the switching performance of the device. In previous work, a rather low switching on-to-off ratio of 3.6 was achieved (90% and 25% detachment when nDEP was on and off respectively), while it took a rather long time of about 4 minutes to detach the majority of the beads (response time). The improved switch would have a significantly shorter response time and higher proportional detachment of beads when 'on' (due to the increase in nDEP force) and lower proportional detachment when 'off' (mainly due to elimination of NaOH) because the weakly-bound beads no longer detach from the surface at the flow rate of operation with nDEP off.

The most effective way of improving the nDEP force is by increasing the gradient of electric field. This can be achieved by increasing the applied voltage at the electrodes. However, upon applying high voltages (greater than 20 Vpp) the electrodes corrode due to the onset of electrochemical reactions at the interface of the electrodes and the solution buffer. To resolve the corrosion issue, we deposited a thin layer of oxide using Atomic Layer Deposition (ALD) to effectively create a physical barrier between the electrodes and the solution buffer in order to the prevent corrosive electrochemical reactions.

Deposition of a thin film oxide layer on the electrodes imposes three major challenges. First, as a part of the device fabrication procedure, a microfluidic channel embedded in PDMS (polydimethylsiloxane) often needs to be covalently bonded (using oxygen plasma treatment) to the surface of the glass chip on which the metal electrodes are patterned. However, the deposition of the oxide layer modifies the surface of the chip, and, the bonding of PDMS to the oxide-deposited glass chip is no longer guaranteed. Thus, the bonding of PDMS to a number of oxide films needed to be investigated. The second challenge is degradation of the electric field in the solution buffer causing a reduction in the dielectrophoresis force, as a result of the undesired voltage drop across the insulating deposited oxide. To compensate for the voltage drop across the oxide film, one may simply increase the applied voltage at the electrodes, but that leads to the third challenge, the oxide breakdown of the deposited thin oxide film upon application of high voltages. To address the latter two challenges, a careful circuit analysis was required to systematically identify the relevant parameters and the trade-offs involved in our proposed system.

B. Theoretical Background: Circuit Model and Analysis

Figure 10:
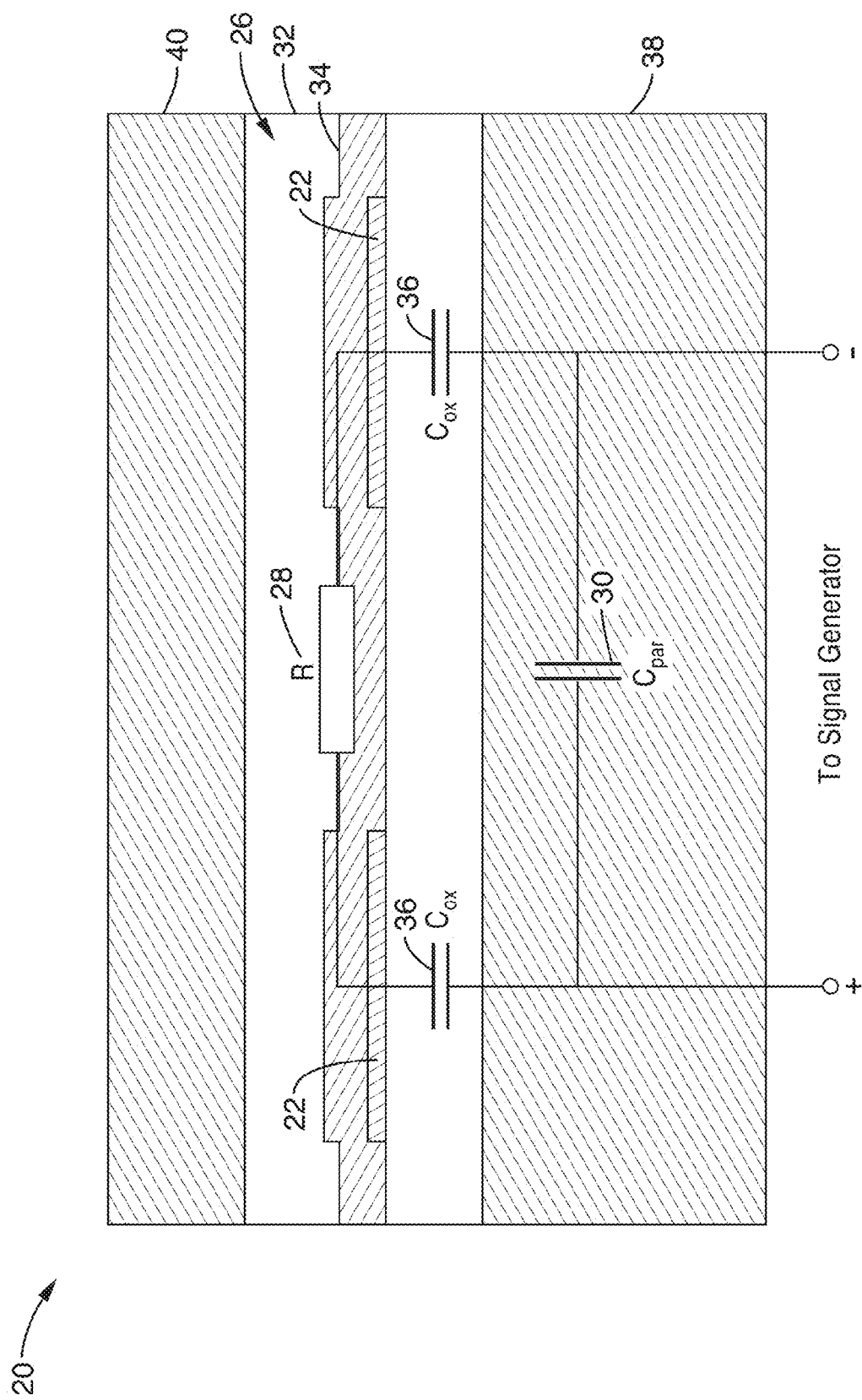
FIG. 10 is a schematic diagram of a simplified equivalent circuit model of the two neighboring electrodes in the interdigitated electrode pair. R refers to the resistance of the channel. $C_{ox}$ is the capacitance of the deposited oxide layer for each electrode-oxide-electrolyte interface, and $C_{par}$ is the parasitic capacitance.

The model shown schematically in FIG. 10 represents the simplified circuit model 20 of the interface between the two neighboring electrodes 22 in our interdigitated electrode pair with the solution buffer 26 filling the microfluidic channel 32 and thin film layer of oxide 34 covering the electrodes 22 embedded in the substrate 38 which could be glass, a Si wafer or equivalent material. The housing 40, PDMS in this example embodiment, forms the microfluidic channel 32. The conducting medium, i.e. the solution buffer 26, can simply be modeled as resistance 28. The parasitic capacitance 30 represents the direct coupling between the two neighboring electrodes 22. The interface between the oxide-deposited electrodes 22 and solution buffer 26 is effectively an insulator in between two conductors (electrode 22 and solution buffer 26) and can be modeled as capacitance 36. In our case, the double-layer capacitance is significantly larger than the capacitance 36 of the thin film deposited oxide 34 due to double-layer capacitance's smaller thickness and higher effective dielectric constant. Therefore, as it is effectively in series with the oxide capacitance 36, the double-layer capacitance can be neglected.

With the voltage applied at the two electrodes 22 the oxide capacitances 36 at each terminal form a voltage divider with the solution buffer resistance 28. Consequently, there would be an unwanted voltage drop across the oxide 34 films at each end, leading to electric field degradation inside the solution buffer and significant reduction in the available nDEP force.

From a circuit analysis point of view, this issue can be resolved by configuring the system such that the impedance of the oxide capacitance 36 is significantly smaller than that of the solution buffer 26. This can be done through a number of complimentary approaches. First is to use a low conductive solution buffer, such as deionized (DI) water or diluted PBS (phosphate-buffered saline) in the wash step. This increases the resistance of the buffer 28 and minimizes the voltage drop across the oxide film 34. Moreover, we need to excite the electrodes 22 at high frequency of operation to effectively reduce the impedance of the oxide film 34 as compared to the buffer resistance 28. Fortunately, in our case this is aligned with the requirement for operating at high frequencies to accomplish ultra nDEP. Finally, the reduction in the oxide film impedance can also be accomplished through minimizing the thickness of the deposited oxide film 34. However, that may result in oxide-breakdown.

We simulated the circuit model of our network for different values of oxide film 34 thicknesses based on the first-order estimated component values. For this simulation, it was assumed the solution buffer 26 was DI water, the deposited oxide film 34 was silicon dioxide ($SiO_2$), and that 100 V is applied at the electrodes 22. Furthermore, the dimensions of the electrodes 22 and channel 32 in the simulation were designed the same as that of the fabricated device.

Figure 11:
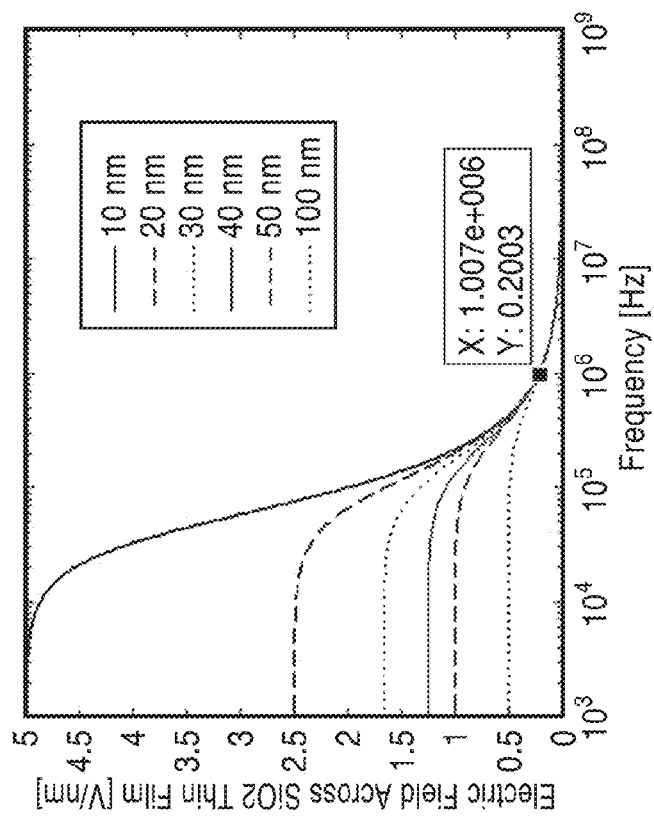
FIG. 11 is a graph of a simulated voltage drop spectrum across the oxide capacitance at each electrode-buffer interface for various oxide thicknesses.
Figure 12:
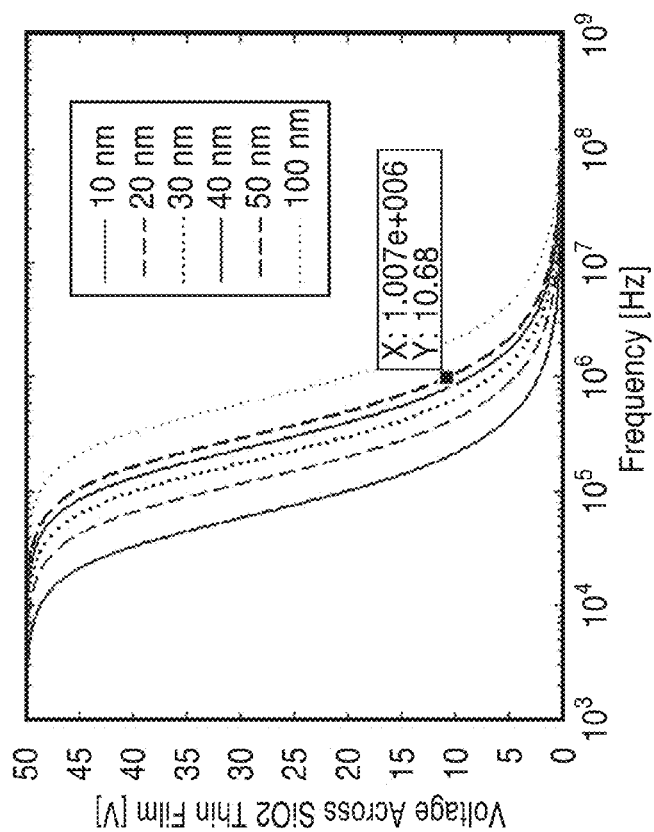
FIG. 12 is a graph of an electric field spectrum across the oxide capacitance at each electrode-buffer interface for various oxide thicknesses.

FIG. 11 and FIG. 12 illustrate the corresponding simulated voltage drop and electric field spectrum across the oxide capacitance at each electrode-buffer interface. As can be seen from FIG. 11, at 1 MHz there is 20% voltage drop across the 50 nm-thick oxide film. The voltage drop can be minimized further (below 5%) when using the oxide with 10 nm thickness. The simulation results in FIG. 12 show that at a frequency of about 1 MHz and beyond, the electric field characteristics across the oxide films of varying thicknesses converge and become independent of the thickness of the oxide. This can be best explained analytically as the following:

$$V_C = \left| \frac{1}{1 + j2\pi f \frac{RC_{ox}}{2}} \right| \frac{V_{app}}{2} \xrightarrow{\text{at high frequencies } f \gg 1/RC} V_C \cong \frac{1}{2\pi f RC_{ox}} V_{app} = \frac{t}{2\pi f R\varepsilon A} V_{app} \quad (1)$$

where VC is the voltage drop across the oxide capacitance $C_{ox}$ at each end of the electrode, R is the resistance of the solution buffer between the two neighboring electrodes, and $V_{app}$ is the applied voltage with the excitation frequency f. Here, the oxide capacitance $C_{ox}$ to the first order can be modeled as a parallel plate capacitance, with permittivity $\varepsilon$, thickness t, and area A (equal to the area bound by the width of the channel and an electrode). Therefore, the electric field EC across the oxide at high frequencies becomes:

$$E_C = \frac{V_C}{t} \cong \frac{1}{2\pi f R\varepsilon A} V_{app} \quad (2)$$

C. Relevant Forces

In addition to the ultra nDEP force, the particles that are bound to the surface experience gravitational force and hydrodynamic drag force. Moreover, for our ultra nDEP platform, since the applied voltage is increased, electrothermal effects may become apparent.

The gravitational (sedimentation) force that acts on the particle is governed by the following equation:

$$F_{Sed} = \frac{4}{3}\pi r^3 (\rho_b - \rho_m) g \quad (3)$$

where g is the gravitation constant, $\rho b$ is the bead density, $\rho m$ is the medium density, and r is the particle radius. For a 2.8 μm diameter polystyrene-magnetic bead, this comes to approximately 10 fN, which is orders of magnitude smaller than the other forces in our system.

The hydrodynamic drag force on a bead attached to the surface of the channel can be approximated with the following equation:

$$F_{Drag} = 6\pi r k \eta v_f \quad (4)$$

where r is the bead radius, k is a non-dimensional factor accounting for wall effects (k≈1.7), η is the dynamic medium viscosity, and $v_f$ is the fluid velocity. Based on the results from our previous work on quantification of biomolecular interactions, flow rates ranging from 10 nLmin$^{-1}$ to 10 μLmin$^{-1}$ provide drag forces of between 0.2 pN to 200 pN on a 2.8 μm diameter bead.

In our high voltage system, the other relevant force is the electrothermal body force acting on the fluid. This electrothermal effect is due to spatial variations in the electric field that causes non-uniform Joule heating and spatially varying permittivity and conductivity fields in the fluid. In the presence of an externally applied electric field, this results in Coulomb and dielectric body forces and induces micro-scale fluid motion. Following the approach presented by Meinhart and colleagues, the temperature profile of the system was simulated using COMSOL (COMSOL, Stockholm, Sweden) and the fluid velocity field resulting from the electrothermal effect was determined. Based on our simulation results for our electrode and microfluidic channel configurations, with a low-conductive buffer solution and applied voltage of 50 to 100 Vpp, the equivalent hydrodynamic drag force exerted on the beads due to induced fluid motion was on the order of 6 to 60 pN.

Dielectrophoresis is a force applied to particles in a non-uniform electric field as a result of differences in polarizablity of the particle and the fluid medium. The first order time-average DEP force acting on a dielectric sphere is given by:

$$F_{DEP} = 2\pi \in_0 \in_m r^3 Re\{f_{CM}\} \nabla |E_{RMS}|^2 \quad (5)$$

where $\in m$ is the relative permittivity of the surrounding medium, r is the particle radius, and ERMS is the root mean square value of the electric field. fCM in the above equation is the Clausius-Massotti factor which is related to the effective polarizability of the particle with respect to that of the medium, and is of the form:

$$f_{CM} = \frac{\varepsilon_p^* - \varepsilon_m^*}{\varepsilon_p^* + 2\varepsilon_m^*} \quad (6)$$

where $\in p^*$ and $\in m^*$ are the relative complex permittivities of the particle and the medium respectively.

The sign of the real part of the Clausius-Massotti factor determines whether the particle is attracted to (positive DEP) or repelled from (negative DEP) a region of high electric field strength. Based on our previous results, in order to achieve DEP in its negative form for the medium conductivity range of interest, we need to operate at the frequencies of above 1 MHz. This is aligned with the frequency requirement imposed by our circuit analysis. It was shown that by using micron sized interdigitated electrodes, it is possible to provide nDEP forces ranging from 1-100 pN when applying 1 to 10 Vpp at the electrodes. A typical antigen-antibody interaction is roughly on the order of 400 pN. As FDEP is proportional to the square of the applied voltage, by increasing the capability to apply higher voltages at the electrodes, we were able to increase the nDEP significantly beyond this value to comfortably detach the bound beads from the interior surface of the microchannel.

D. Experimental Section i. Fabrication

It should be appreciated that different material can be used for fabrication of the following embodiment and that this description is given as an example and not by limitation.

The microchannel in this embodiment of the present invention with a 200 μm width, 50 μm height, and 1 cm length was fabricated in polydimethylsiloxane (PDMS). The master mold for the microchannel was patterned onto a silicon substrate using SU-8 photoresist. PDMS (10:1 pre-polymer/curing agent) was poured onto the master mold and allowed to cure at 80° C. overnight. Once the PDMS channel was formed, it was peeled off from the mold. Two holes with a diameter of 3 mm were punched, one at each end, to create the channel's inlet and outlet ports.

To fabricate the electrodes, standard evaporation and lift-off processing techniques were used. An array of interdigitated Au/Cr electrode (IDE) pairs was fabricated on a glass substrate with an electrode width and spacing of 7 μm each. Then, using ALD techniques, a 10 nm oxide film was deposited on the surface of the device. The surface was selectively oxide-etched (dry etched) to expose and access the electrical bonding pads. The oxide-deposited electrode chip and the PDMS microchannel were then aligned and bonded together after standard oxygen plasma treatment. All three available oxide films ($SiO_2$, $Al_2O_3$, and $HfO_2$) were used on different devices to test for PDMS bonding using our standard plasma treatment process.

ii. Sample Preparation and Surface Chemistry

To demonstrate the switch-like functionality in eluting specifically-bound beads from the surface of the channel, we chose anti-IgG-IgG interactions that are of the same order of magnitude in strength as typical antibody-antigen interactions. For this purpose, 2.8 μm-diameter goat anti-mouse IgG covered beads (initially in a 0.5% w/v suspension) were used. 250 μL of this solution was washed with PBS (containing 1% BSA and 0.05% Tween) and resuspended in 50 μL of 30×-diluted PBS.

To prepare the channel surface for this interaction, mouse IgG (originally 2 mg/mL, diluted by ×100) was pipetted into the channel. The solution was allowed to incubate for 20 minutes to be physically adsorbed on the channel surface. This was followed by introducing BSA in the channel to eliminate non-specific bindings. The channel was then flushed and filled with diluted PBS. To control test for the specificity of bindings, the above steps were performed on a separate chip, except for the addition of IgG. This verifiably and effectively eliminated the possibility of attachment of beads to the surface through non-specific-bindings.

iii. Experiment Setup

We used an impedance spectroscope (Zurich Instruments HF2IS, Switzerland) and a transimpedance amplifier (Zurich Instruments HF2TA, Switzerland) to capture the impedance spectrum of the device in order to validate and characterize the equivalent circuit model of the device. This impedance spectroscope was also used as a signal generator in conjunction with a high voltage 50 V/V amplifier (Trek 2100HF, USA) to excite the electrodes with sine wave at 2 MHz. Furthermore, a syringe pump (Harvard Apparatus, USA) was used to control the flow rate through the device.

iv. Experimental Procedure

First, to validate the developed circuit model of the device, we measured the impedance spectrum between the two IDEs (interdigitated electrodes). Deionized (DI) water with a measured conductivity of 1.2 mS/m was used as the solution buffer. Next, we characterized the voltage tolerance of the fabricated device by increasing the applied voltage in small steps and scanning the impedance spectrum at each point to see whether or not the device parameters had stayed the same or significantly changed due to oxide breakdown or other undesired irreversible effects.

Finally, we demonstrated the core functionality of the device. We first flushed the channel with diluted PBS to eliminate the air bubbles. Next, the prepared sample beads were injected into the channel by directly pipetting them into the inlet port. The beads were allowed to settle for 15 minutes so that they had sufficient time to bind to the interior surface of the microchannel. Negative pressure was applied to the syringe, which was connected to the outlet well through Tygon tubing, to pull the solution. The flow rate was controlled with the syringe pump. All experiments were video recorded using Digital Microscope Camera ProgRes MF (Jenoptik, Germany) that was mounted on a microscope (Nikon, Japan).

For each experiment, the device on the imaging stage was positioned such that the imaging camera's field of view covered the portion of the channel with the IDEs as well as the neighboring region along the channel with no electrodes. By applying voltage at the electrodes we turned ultra nDEP on. The upward nDEP force caused the specifically-bound beads to be pushed away from the surface of the IDEs, without disturbing the bound beads on the neighboring no-electrode zones along the channel. To detach the remaining bound beads, the flow rate and hence drag force was increased gradually until all of the beads were eluted. At each flow rate, we quantified the percentage of detached beads relative to total number of initially captured beads (at rest). To quantify the beads accurately and efficiently, we used a custom-made automated video and image processing software. Using this software, and by comparing the consecutively captured frames, we were able to distinguish between the stationary beads that were actually bound and the moving beads that were not originally bound. If analyzing only a single frame captured at low flow rate, the moving beads might have appeared stationary and been mistakenly quantified as stationary bound beads. Overall, this experimental procedure was repeated on three different devices where we analyzed a total of 9,000 beads.

E. Results and Discussion

Applying the standard plasma treatment process at the PDMS bonding step was only successful for the $SiO_2$ coated film. It formed a strong bond with the same order of magnitude in strength as PDMS-glass bonding which is amenable to microfluidic pressure driven applications. The same treatment processes did not result in a strong bond for $Al_2O_3$ and $HfO_2$ coated thin films. At this step, since we achieved a well-sealed and practical device with the $SiO_2$ coated chip (no outside channel leakage at the flow rates of interest and beyond), we proceeded with our experiments using the $SiO_2$-coated devices.

Figure 13:
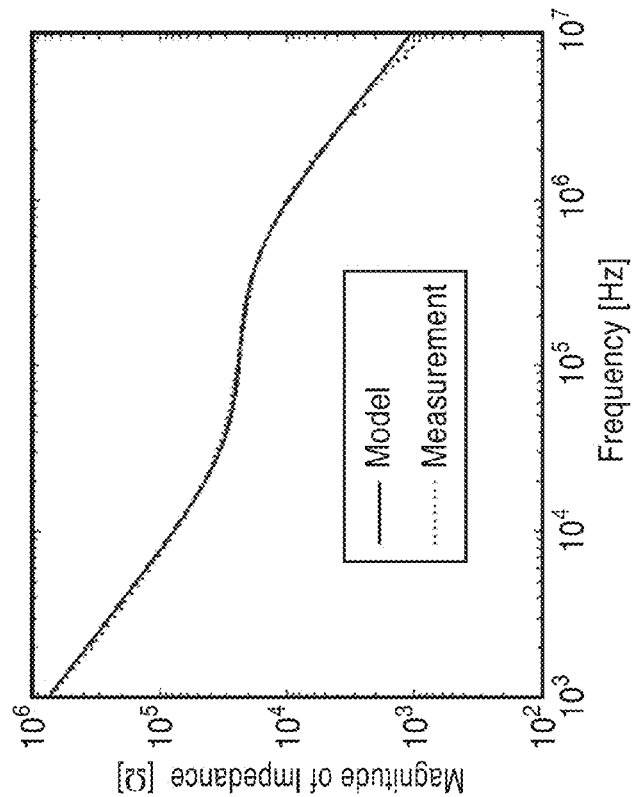
FIG. 13 is a graph of an impedance spectrum (measured vs. curve-fitted model) between the two neighboring electrodes in the interdigitated electrode pair.

FIG. 13 illustrates the measured impedance spectrum between the two IDEs. In this graph, the curve-fitted spectrum based on the equivalent circuit model is also overlaid. The close agreement between the two graphs not only supports our developed circuit model for the device, but also allows us to characterize and extract the resistance value of the buffer as well as the oxide and parasitic capacitance values.

Figure 14:
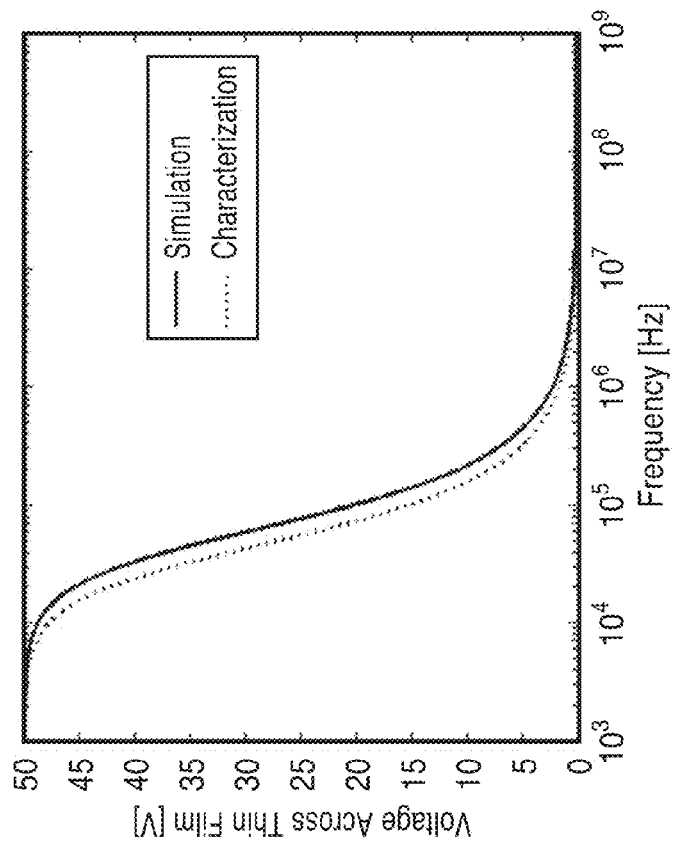
FIG. 14 is a graph of the characterized vs. simulated voltage drop spectrum across the deposited 10-nm $SiO_2$ layer on the electrodes.
Figure 15:
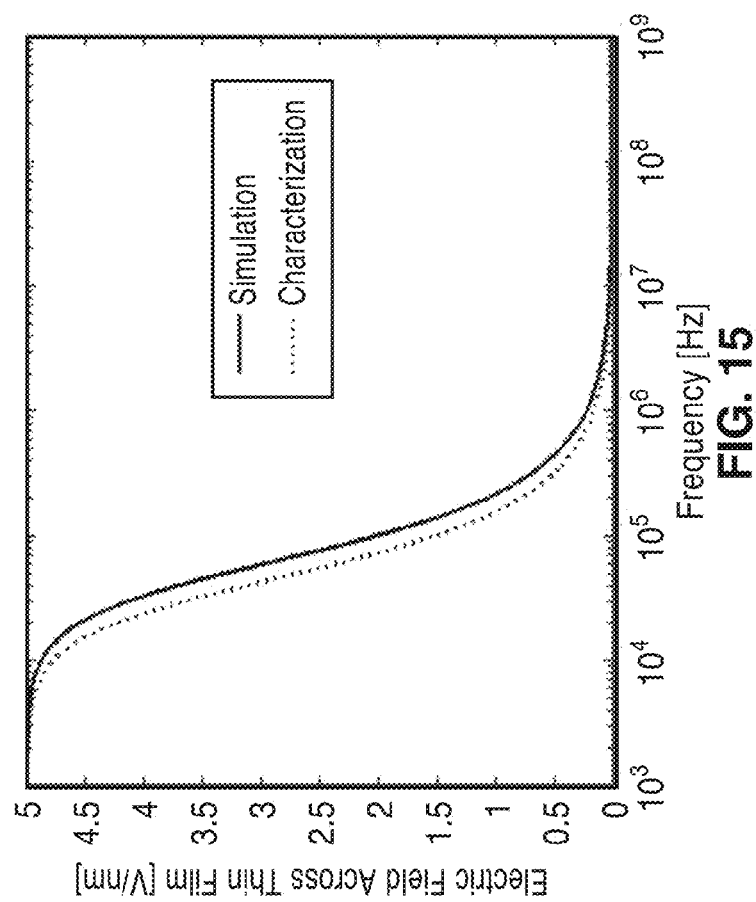
FIG. 15 is a graph of the characterized vs. simulated electric field spectrum across the deposited 10-nm $SiO_2$ layer on the electrodes.

Upon validation of the circuit model, the characterized values from the measured impedance spectrum were used to plot the voltage drop and the electric field characteristic across the deposited oxide film for the frequency range of interest. FIG. 14 and FIG. 15 illustrate these characteristics as well as the corresponding originally simulated voltage drop and electric field spectrum, based on our first-order estimate of the resistance and capacitance values. As can be seen from these graphs, our simulation and measurements results are close. The slight deviation between them implies that the simulation results originally led us to a more conservative conclusion by projecting a higher voltage drop for a given frequency. Based on the above results, and the available margin in design space specifications, we can also conclude that using a more conductive solution such as diluted PBS as our buffer would still be practical when demonstrating the improved switching capability of ultra nDEP.

Our voltage tolerance characterization process indicated that our device can practically provide up to 100 Vpp. As was visually evident and confirmed through comparison of impedance spectrums of the device captured at each incremental voltage step, there was no sign of damage and the device parameters stayed the same. However, once the applied voltage was increased to 120 Vpp, a bubble started to form. Specifically, the formation took place where the two neighboring electrodes were actually closer to each other than the rest of the neighboring electrodes, due to variations in the fabrication of the electrodes. As a result of the smaller electrode spacing, the electric field in the proximity of the two tightly-spaced electrodes was higher than the rest of the electrodes region. This translated into higher generated heat locally at the proximity of the two electrodes. We speculate that the bubble formation can be attributed to the generated heat in the channel resulting in an outgassing or evaporation phenomena, with temperatures approaching the boiling point.

Figure 16:
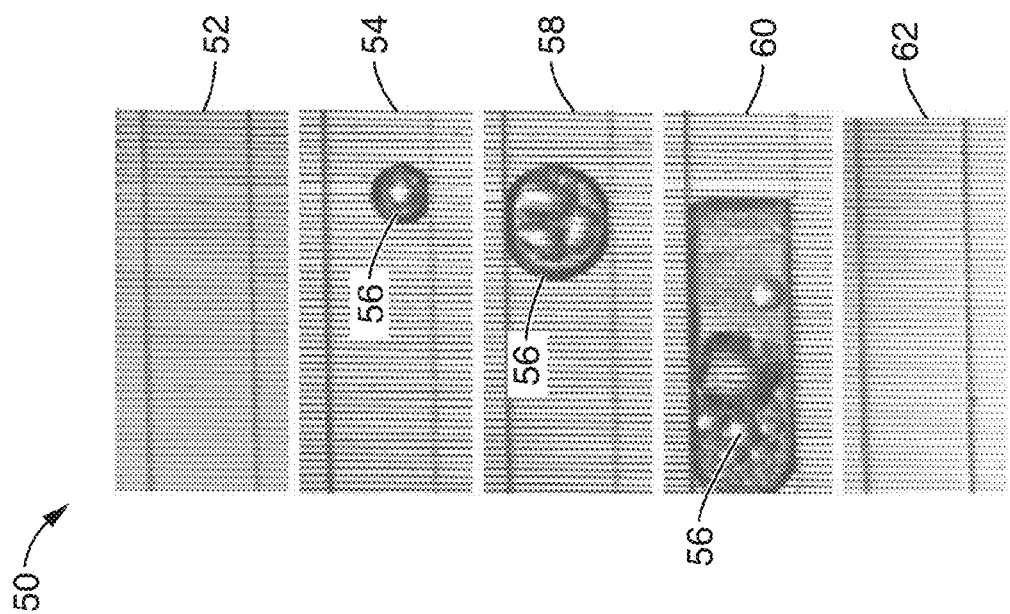
FIG. 16 is a set of photographs illustrating that the upper bound on the voltage tolerance of the improved DEP device is limited by the bubble formation inside the channel due to the generated heat.

FIG. 16 is a set of images 50 of a region of the channel taken at different applied voltages and time points. The first frame 52 shows the channel with 0-100 Vpp. The second frame 54 shows the channel with 120 Vpp after 60 seconds. As shown in this image, bubbles have formed 56 within the channel. The third frame 58 shows the channel with 120 Vpp after 75 seconds. Here, the bubbles 56 have increased. The fourth frame 60 shows the channel with 120 Vpp after 90 seconds where the whole channel is filled with bubbles 56. The last frame 62 shows the channel after it has been flushed and refilled with no bubbles.

To ensure that the device integrity was preserved after the bubble formation, the channel was flushed and filled with buffer. Then, by capturing the impedance spectrum, we verified that the device parameters stayed the same. We repeated the same procedure for three other devices to verify the bubble formation at high voltages (about 120 V), while subsequently validating the preserved device integrity after flushing and filling the channel.

It's worth noting that we have demonstrated a design where approximately 100 Vpp of voltage is effectively dropped across the buffer with minimal voltage and field degradation across the deposited oxide. This implies voltage tolerance improvement of a factor of 5 is has been achieved, resulting in a 25-fold stronger nDEP for the same interdigitated electrode configuration. Moreover, with our fabricated device, the upper bound on the electrode's voltage tolerance is no longer imposed by fabrication limitations (such as electrode corrosion in the previous work, or other irreversible phenomena such as oxide breakdown etc.), but in fact is restricted by physical phenomena affecting the buffer.

Figure 17:
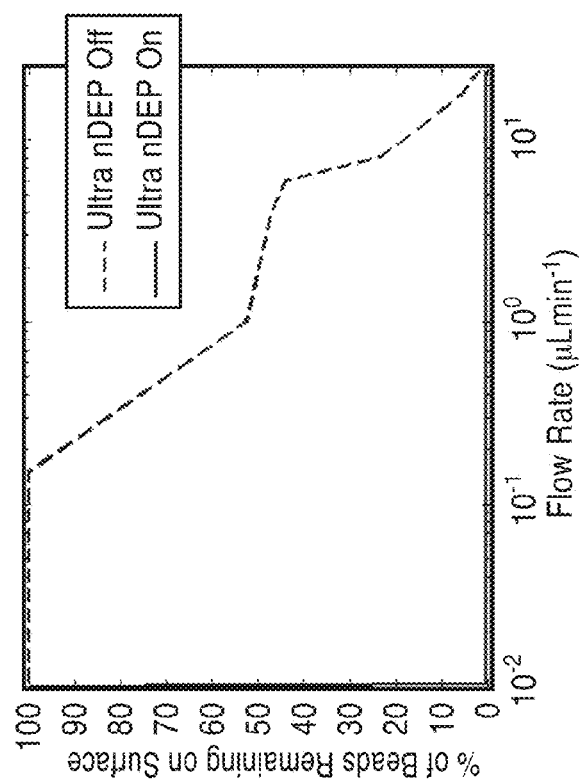
FIG. 17 shows a graph of the percentage of beads remaining on the surface after the experiment.

To demonstrate the switching functionality of the device, the collective result for the anti-IgG-IgG interaction is shown in FIG. 17 when ultra nDEP is off (the regions outside the IDEs) and when ultra nDEP is on (applying 50 Vpp at 1 MHz). Upon turning ultra nDEP on, almost all (99.8%) of the bound beads on the interdigitated electrode region were eluted without disturbing the bound beads on the neighboring no-electrode zones along the channel. The remaining bound beads outside the interdigitated electrodes region (represented as the ultra nDEP-off curve in FIG. 17) were detached as we increased the flow rate gradually. For this case, no beads were detached during flow rates of approximately 0.15 µLmin$^{-1}$, and the flow rate had to be increased to 0.33 µLmin$^{-1}$, 2.40 µLmin$^{-1}$, and 15.1 µLmin$^{-1}$ (equivalent drag forces of about 7 pN, 50 pN, and 300 pN) in order to remove 10%, 50%, and 90% of the bound beads, respectively.

Finally, we further demonstrated our device's much improved functionality as a switch. The relevant performance measures in our context are ideally zero-switching response time upon turning the switch on, and 0 and 100% bead detachment when the switch is off and on, respectively. In this experiment, after sample and surface chemistry preparation and allowing for the injected beads to settle and bind to the surface, the flow rate was set to 0.15 µLmin$^{-1}$ and allowed to run for a total of 10 minutes. Ultra nDEP was turned on at the end of the 5th minute.

Figure 18:
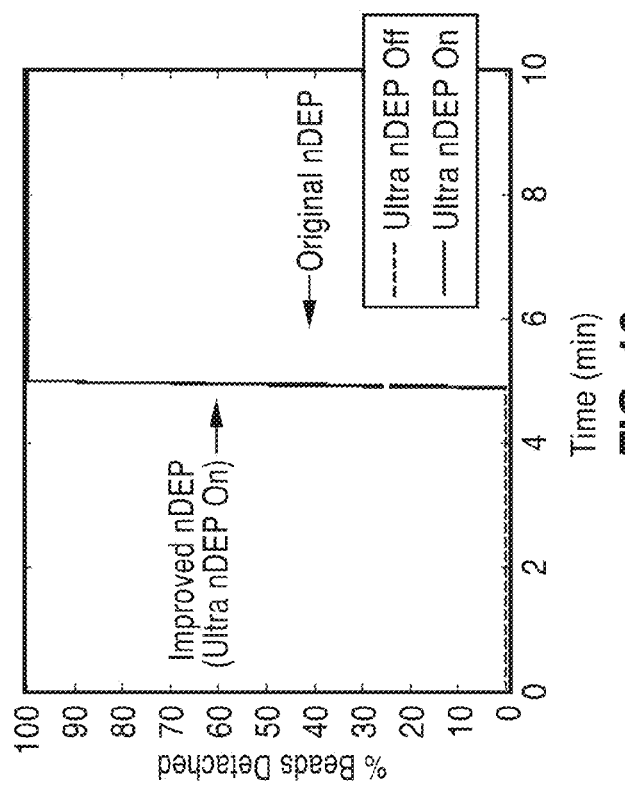
FIG. 18 is a graph of the bead detachment time profile at a flow rate of 0.15 μLmin$^{-1}$ using the improved vs. original nDEP device.

FIG. 18 illustrates the bead detachment time profile for this process, as well as the detachment profile for the previous work with the non-improved nDEP device. As can be seen from this figure, at 0.15 µLmin$^{-1}$, a very small fraction of beads (about 0.3%) became detached in the first five minutes while nDEP was off. At the end of the 5th minute, once ultra nDEP was turned on, as expected, 99.8% of beads were eluted immediately, resulting in an on-to-off ratio of 333 which is about two orders of magnitude improvement in this measured performance as compared to the previous work, where an on-to-off ratio of 3.6 was demonstrated. Moreover, the elution of beads took place almost instantly, unlike the previous work, where it took at least 4 minutes to detach the majority (90%) of beads. Specifically, upon applying ultra nDEP and within one frame of the captured video (with a frame-capture interval of 0.4 s) the beads were fully detached. This shows an improvement in switching response time of at least 600-fold. Representative captured snapshots from the video recorded experiment at 0 s and 0.4 s are shown in FIG. 19A and FIG. 19B, respectively.

These results demonstrate that by improving the strength of nDEP, we have successfully developed a robust microfluidic switch to elute specifically-bound beads. The enhanced ultra nDEP switch not only eliminates the need for eluting agents, but also shows about two orders of magnitude improvement in the switching on-to-off ratio, as well as at least a 600-fold reduction in the switching response time.

EXAMPLE 3

Demonstration of Multiplexed Actuation Functionality

Another embodiment of the subject invention demonstrates a platform that can be used in performing a bead-based multiplexed immunoassay where, in a single microchannel, various regions are functionalized with a different antibody, each targeting a different antigen. In this embodiment, immuno-bound beads are eluted from each individual region of the microchannel for further downstream quantification and analysis. For multiplex analysis, beads need to be selectively eluted from each region one by one as illustrated in FIG. 20.

FIG. 20 is an overview schematic diagram 70 illustrating the elution of immuno-bound particles in a multiplex design embodiment. A microchannel is shown wherein different sets of interdigitated electrodes (IDEs) 72 are mounted on a substrate 74 to be in contact with or exposed to the inside of specific regions 76, 78, 80 of the microchannel 82.

FIG. 21 gives a magnified surface view 90 of the inside of the microchannel 76, 78, 80. In this embodiment, the surface microchannel is functionalized with a primary antibody 92. An antigen 94 which binds to both the primary antibody 92 and secondary antibody 96 can then be used to immobilize a bead 98 to the channel surface. Applying voltage ($V_1$) to a specific region 80 within the microchannel 82 turns ultra nDEP on, resulting in the detachment and elution of beads 84 from the surface of that region 80 of the microchannel 82, without eluting the beads 98, 86 in other regions 76, 78 of the microchannel 82.

Figure 22:
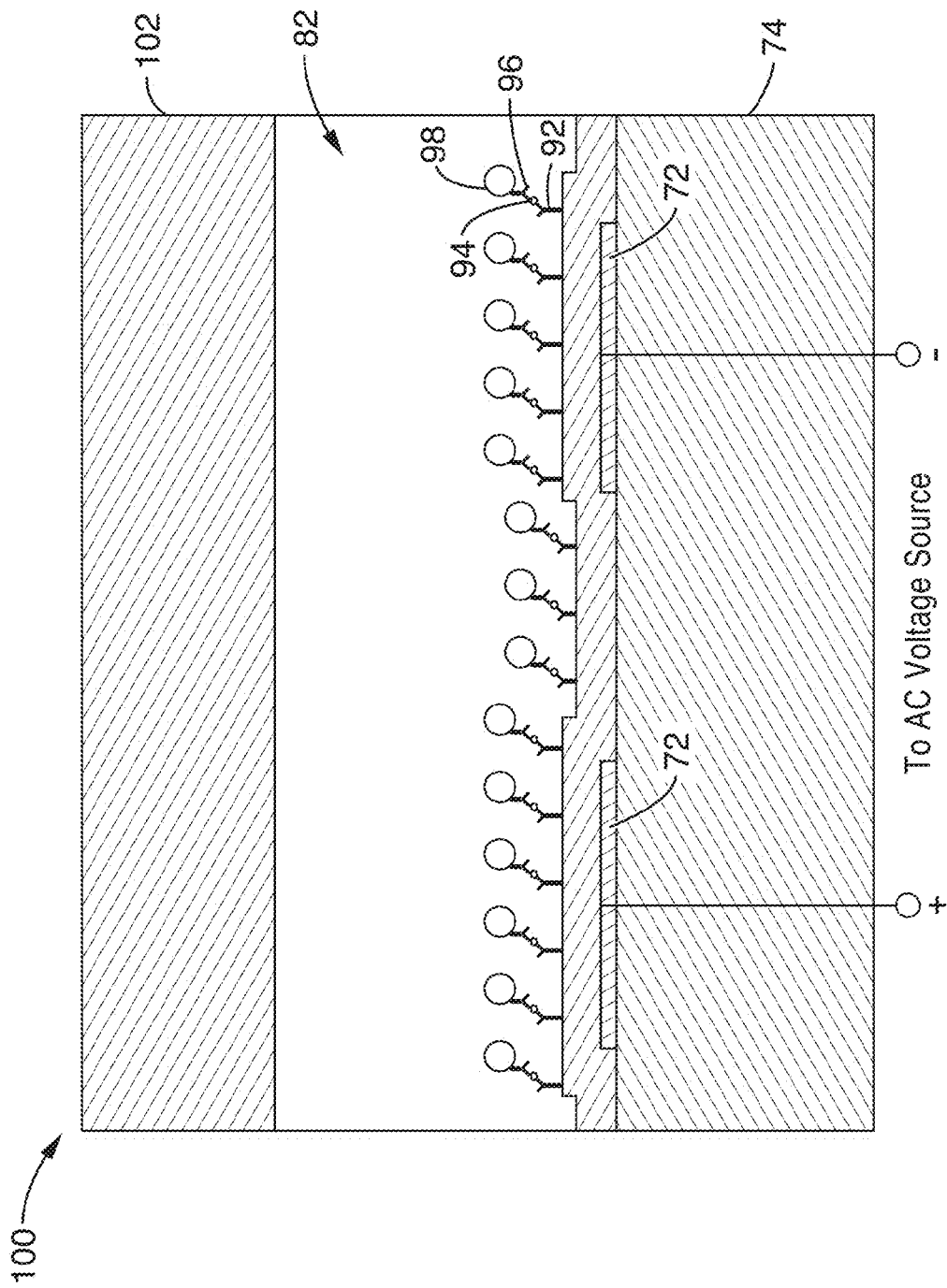
FIG. 22 is a schematic cross-section diagram of two neighboring electrodes in an embodiment of the system.

FIG. 22 is a magnified schematic diagram of a cross-section of the ultra nDEP apparatus. In this diagram 100, the microchannel 82 is formed using a PDMS housing 102. The electrodes 72 are embedded into a substrate 74 as shown in FIG. 20.

Figure 23:
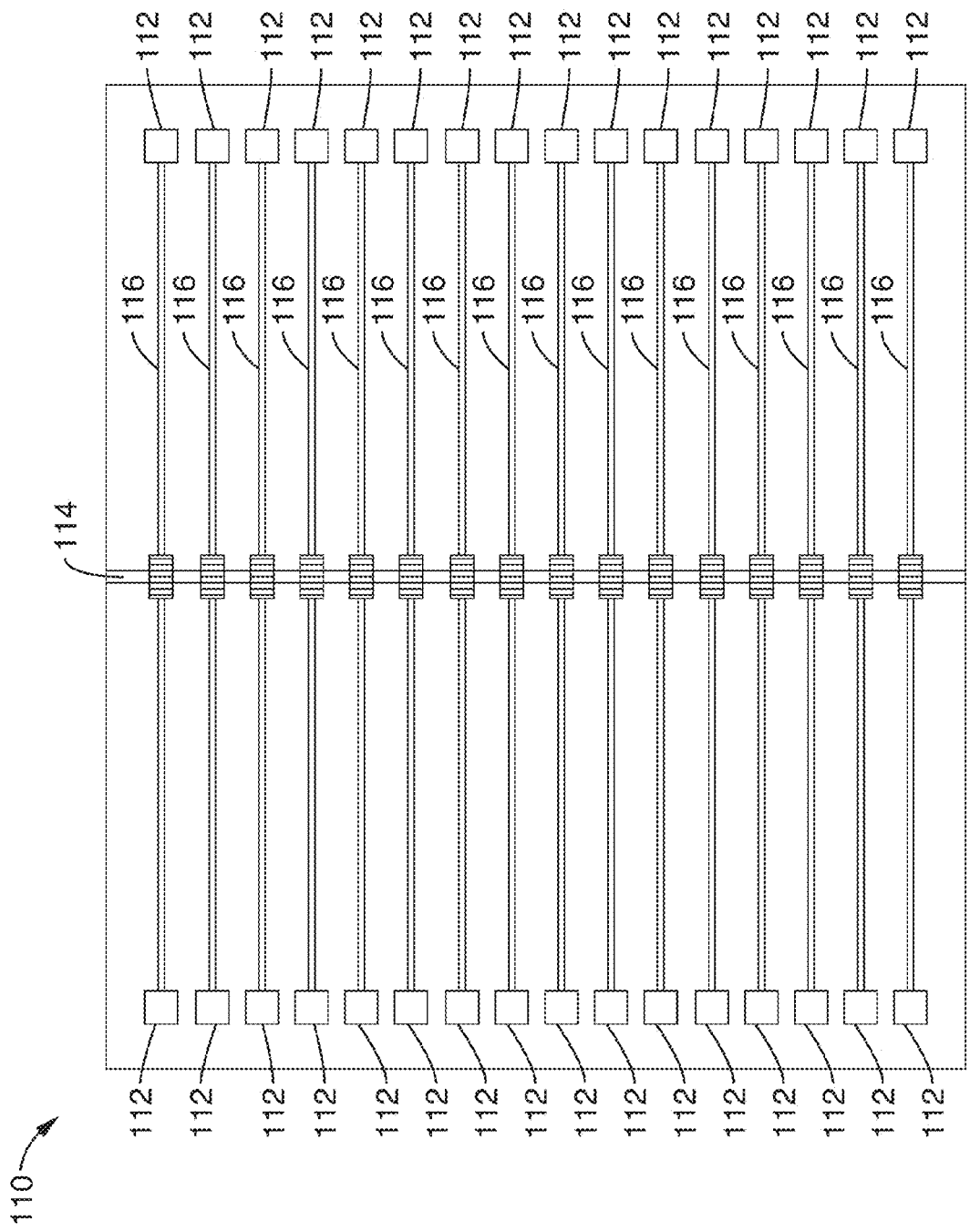
FIG. 23 is a schematic diagram of the multiplexed device where an array of 16 interdigitated electrodes is arranged along a single microfluidic channel.
Figure 24:
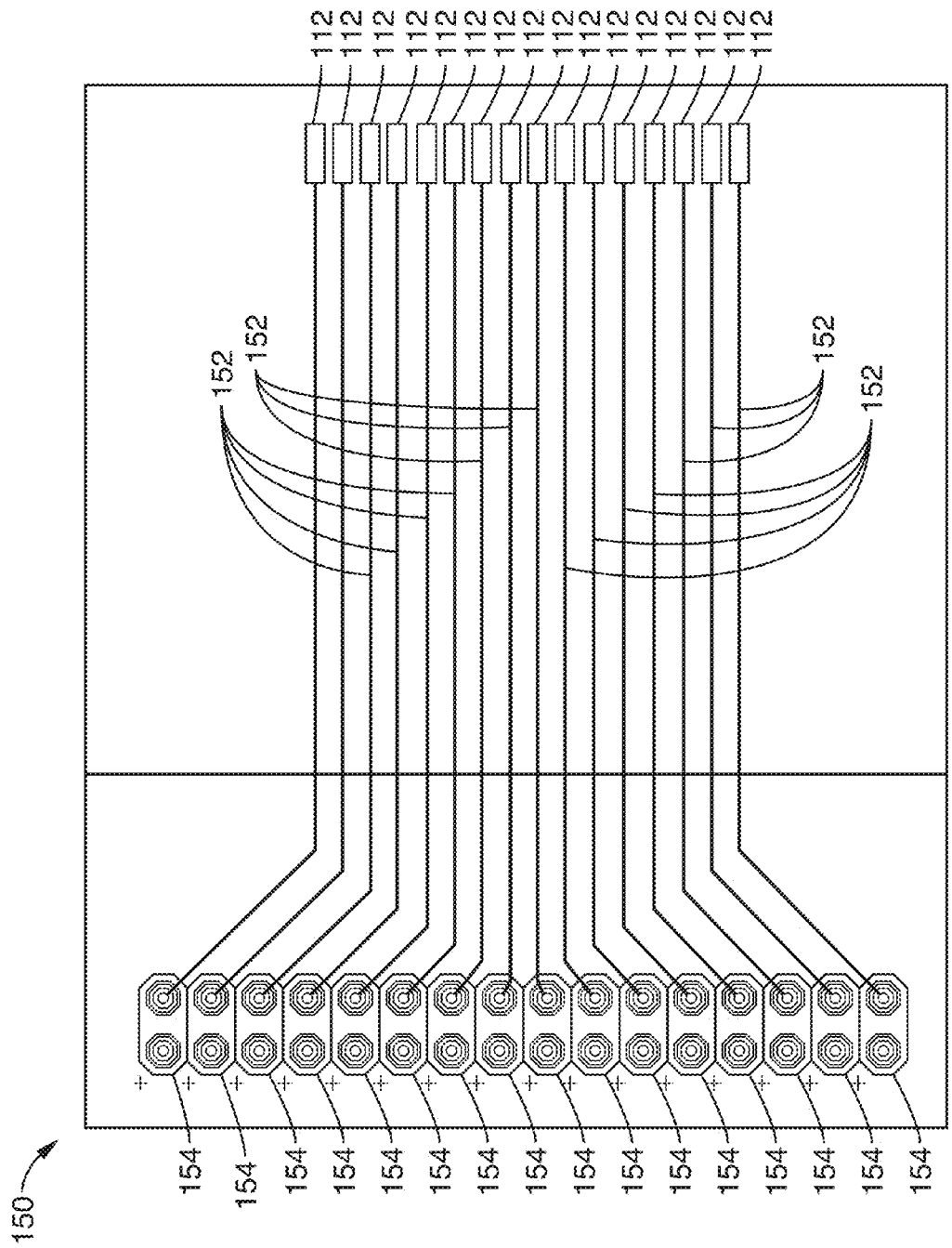
FIG. 24 is a schematic diagram of the flexible PCB designed to interface the patterned array of interdigitated electrodes with the prototyping PCB.

Referring now to FIG. 23, to demonstrate the multiplexed actuation capability of the ultra DEP electrode embodiment, we patterned an array 110 of addressable sixteen interdigitated electrode pairs 116 along a single microfluidic channel 114. The electrical pads 112 connect the wires 152 to the jumpers 154 as shown in FIG. 24. We followed the same fabrication process as described for the singleplex device.

To access the array of interdigitated electrode pairs 116 and to address each electrode pair individually, we designed a flexible Printed Circuit Board (PCB), which is shown in FIG. 24. This flexible PCB 150 facilitates the interface between the array 110 of interdigitated electrodes 116 (patterned on a glass wafer for example) and a prototyping PCB. The prototyping PCB electrically relays the excitation signal to each individual interdigitated electrode pair 116 individually, as shown in FIG. 25.

Figure 25:
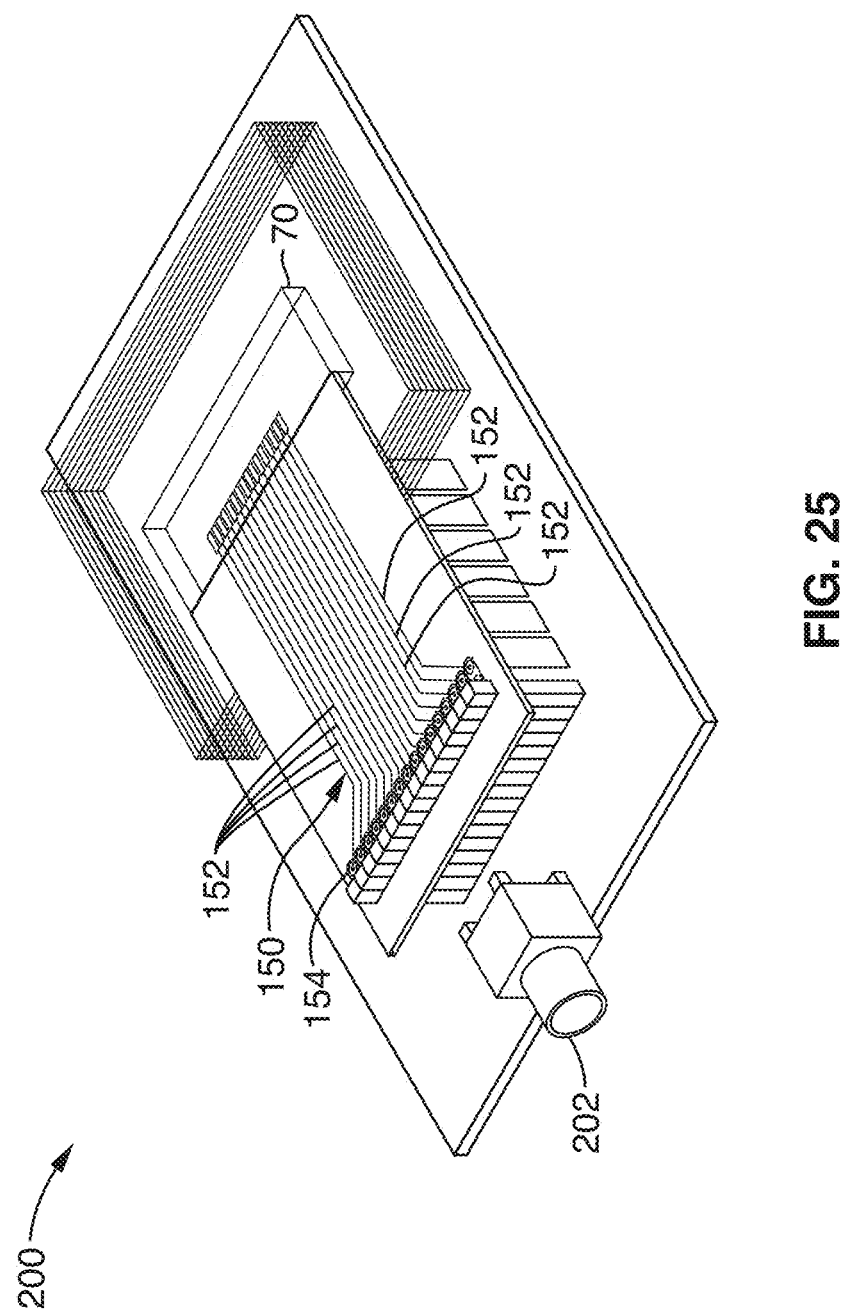
FIG. 25 is a schematic diagram of a flexible PCB that facilitates the interface between the array of interdigitated electrodes (patterned on a glass wafer) with a prototyping PCB. The prototyping PCB electrically relays the excitation signal to each individual interdigitated electrode pair individually.

FIG. 25 shows the assembled multiplexed ultra nDEP device 200 with the flexible PCB 150 connecting the voltage source (not shown) through the AC voltage source connector 202 to the interdigitated electrode pairs 116 within the multiplexed microchannel 70 (see FIG. 20).

Figure 26:
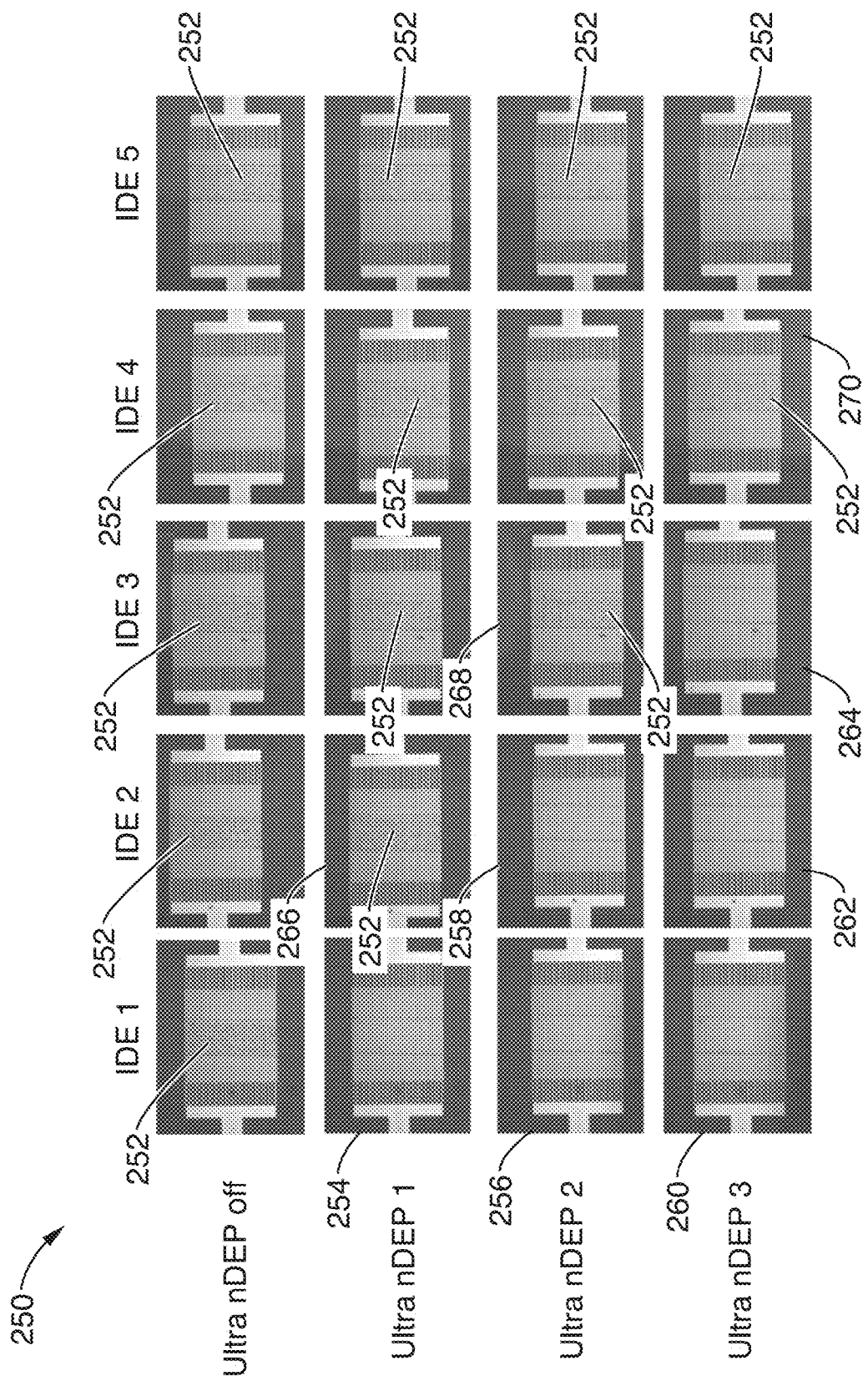
FIG. 26 is a set of representative micrographs that demonstrate multiplexed actuation of specifically bound beads from the surface.

Referring now to FIG. 26, we used our multiplexed ultra nDEP device to demonstrate the selective elution of anti-IgG-IgG bound beads from the surface of the microchannel at each interdigitated electrode pair. FIG. 26 shows a set of images 250 illustrating the results for the multiplexed actuation of specifically bound beds 252, where ultra nDEP was turned on for interdigitated electrodes (IDEs) 1, 2, and 3 sequentially. As can be seen, upon turning each ultra nDEP on, the specifically bound beads 252 on the corresponding (activated) electrodes were eluted (images 254, 256, 258, 260, 262, 264) while the beads 252 on the surface of the other (inactive) electrodes were left undisturbed and remained bound on the surface (images 266, 268, 270). Similarly, ultra nDEP was turned on for IDEs 2 and 3, which resulted in elution of beads from IDEs 2 and 3 respectively, all the while the beads on IDEs 4 and 5 remained undisturbed and firmly bound to the surface.

In another embodiment of the subject invention, this multiplexed array of interdigitated electrode pairs can also be used to perform accurate measurements of biological interactions using force spectroscopy. The DEP force is proportional to the square of the applied voltage. By varying the voltage applied at the electrodes and analyzing the detached beads at each step, one can generate the force spectrum signature of the biological interaction under study. In this regard, our platform offers two advantages. First, as our system is now capable of applying higher voltages and hence higher nDEP forces (ultra nDEP), we can perform force spectroscopy with higher precision and dynamic range. The second advantage is due to the multiplexed arrangement of our system. Multiplexed functionality of our device allows us to perform force spectroscopy multiple times in a single device, under the same sample preparation and buffer conditions. Hence, we are able to repeat force spectroscopy multiple times without being prone to variations in the experiment. Therefore, instead of performing force spectroscopy on a singleplex device 16 times (prone to varying experiment conditions) we can perform the experiment once on a 16-plex device. This would be particularly useful when it is necessary to compare various biological interactions and also when it is necessary to ensure that the experimental conditions stay the same for all biological interactions.

Figure 27:
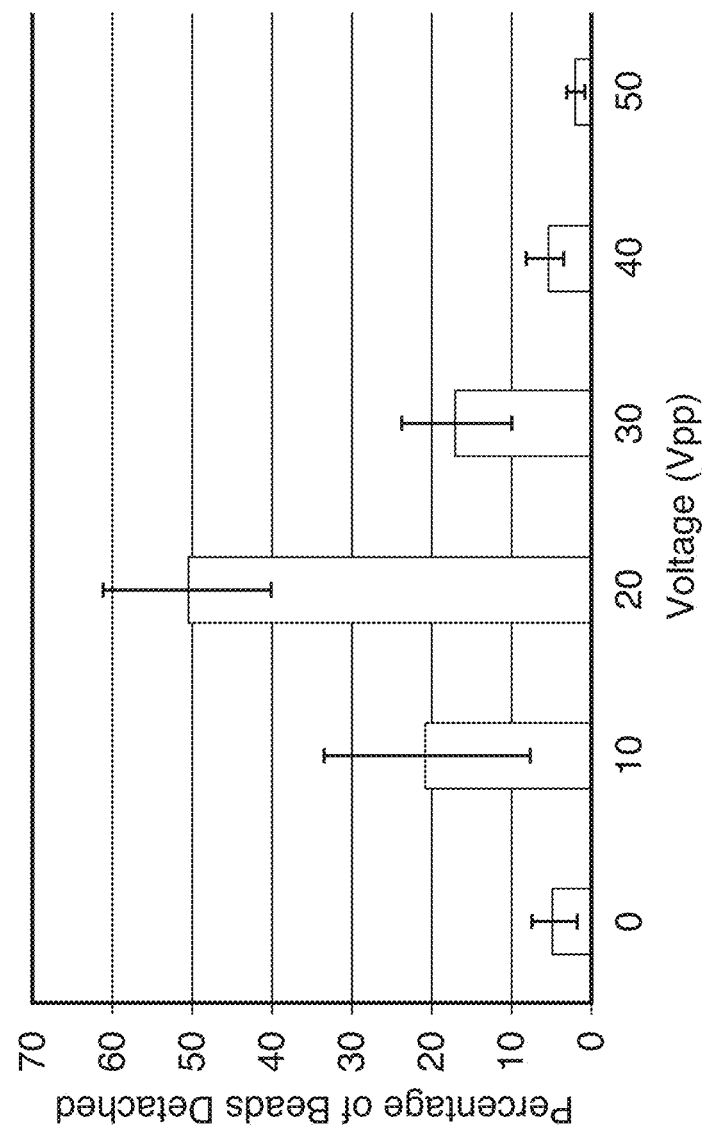
FIG. 27 is a graph demonstrating the force spectroscopy for the anti-IgG and IgG interaction.

FIG. 27 illustrates a demonstration of force spectroscopy for anti-IgG and IgG interaction. The nDEP force is proportional to the square of the applied voltage, which results in a bead detachment profile corresponding to a force spectroscopy signature of the anti-IgG and IgG interaction.

Figure 28:
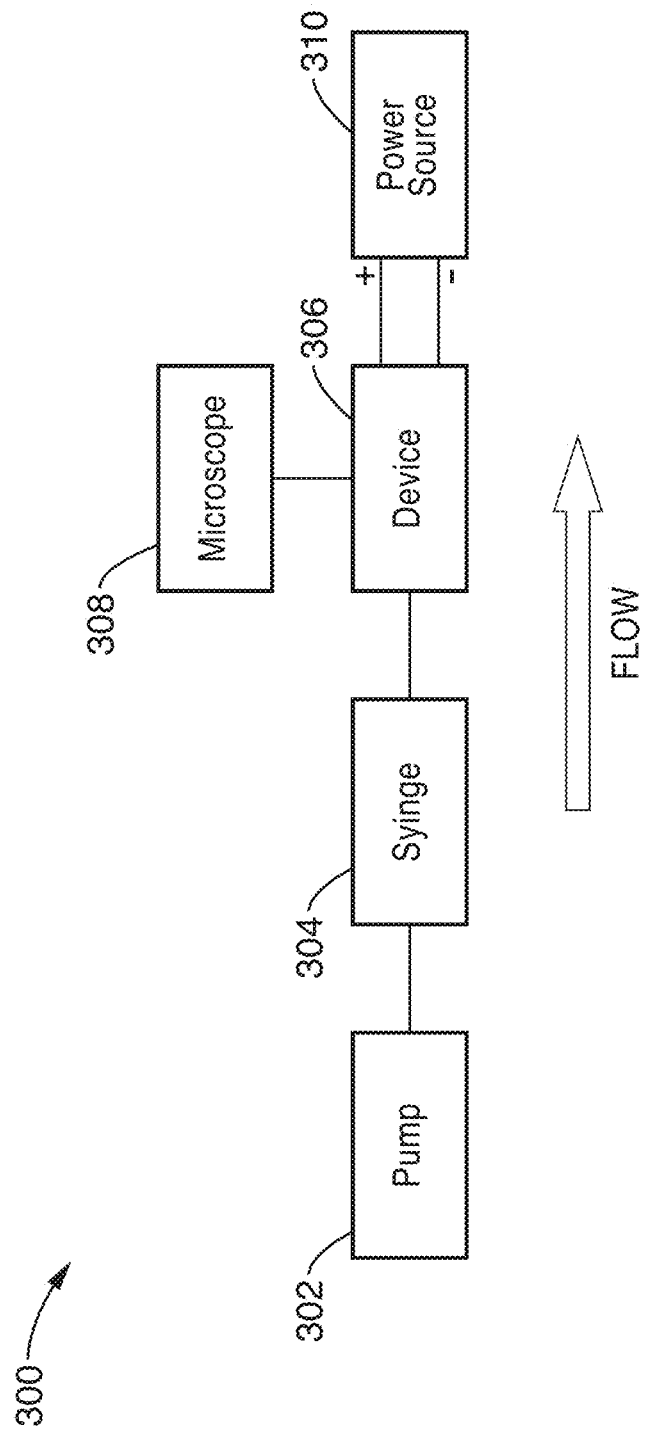
FIG. 28 is a block diagram of the system for separating and quantifying specifically-bound particles within a microfluid.

FIG. 28 shows a block diagram 300 of an embodiment of the subject invention. Blocks 302 and 304 depict the pump and syringe that can be used to control the flow rate through the channel of the device 306. A microscope 308 that can be used to capture images of particle attachment and detachment within the device 306 is also shown in this embodiment. The power source that generates an electric field and the desired nDEP force is shown in block 310.

Embodiments of the present invention may be described with reference to flowchart illustrations of methods and systems according to embodiments of the invention, and/or algorithms, formulae, or other computational depictions, which may also be implemented as computer program products. In this regard, each block or step of a flowchart, and combinations of blocks (and/or steps) in a flowchart, algorithm, formula, or computational depiction can be implemented by various means, such as hardware, firmware, and/or software including one or more computer program instructions embodied in computer-readable program code logic. As will be appreciated, any such computer program instructions may be loaded onto a computer, including without limitation a general purpose computer or special purpose computer, or other programmable processing apparatus to produce a machine, such that the computer program instructions which execute on the computer or other programmable processing apparatus create means for implementing the functions specified in the block(s) of the flowchart(s).

Accordingly, blocks of the flowcharts, algorithms, formulae, or computational depictions support combinations of means for performing the specified functions, combinations of steps for performing the specified functions, and computer program instructions, such as embodied in computer-readable program code logic means, for performing the specified functions. It will also be understood that each block of the flowchart illustrations, algorithms, formulae, or computational depictions and combinations thereof described herein, can be implemented by special purpose hardware-based computer systems which perform the specified functions or steps, or combinations of special purpose hardware and computer-readable program code logic means.

Furthermore, these computer program instructions, such as embodied in computer-readable program code logic, may also be stored in a computer-readable memory that can direct a computer or other programmable processing apparatus to function in a particular manner, such that the instructions stored in the computer-readable memory produce an article of manufacture including instruction means which implement the function specified in the block(s) of the flowchart (s). The computer program instructions may also be loaded onto a computer or other programmable processing apparatus to cause a series of operational steps to be performed on the computer or other programmable processing apparatus to produce a computer-implemented process such that the instructions which execute on the computer or other programmable processing apparatus provide steps for implementing the functions specified in the block(s) of the flowchart(s), algorithm(s), formula (e), or computational depiction(s).

From the discussion above it will be appreciated that the invention can be embodied in various ways, including the following:

1. A microfluidic particle separation system utilizing nDEP techniques in which the particle is selectively attached to a specific surface and then selectively released, thereby facilitating separation, comprising: (a) a housing, said housing forming a microchannel having an interior surface; (b) a particle-attaching chemical species that functionalizes said interior surface; (c) at least two controllable electrodes positioned in the microchannel which when energized facilitate release of a particle attached to the interior surface of the microchannel by subjecting the particle to a desired non-uniform electric field (nDEP); and (d) a means for generating an electric field for subjecting thed microchannel to the desired non-uniform electric field (nDEP); (e) wherein the controllable electrodes are connected to the means for generating an electric field.

2. A system according to any preceding embodiment, wherein the particle-attaching chemical species is a biological macromolecule having an affinity for the particle.

3. A system according to any preceding embodiment, wherein the attaching to and releasing from the particle-attaching chemical species are influenced by base concentration in the microchannel.

4. A system according to any preceding embodiment: (a) wherein the controllable electrodes are coated with an oxide layer; and (b) wherein the means for generating an electric field generates an nDEP force strong enough to break a molecular bond of at least approximately 400 pN.

5. A system according to any preceding embodiment, wherein a desired region of the microchannel is subjected to the nDEP thereby facilitating release of particles only from the desired region of the microchannel.

6. A microfluidic particle separation method utilizing nDEP techniques in which the particle is selectively attached to a specific surface and then selectively released, thereby facilitating separation, comprising: (a) providing a housing, said housing forming a microchannel having an interior surface; (b) functionalizing the interior surface with a particle-attaching chemical species; (c) contacting a particle with the functionalized interior surface, thereby initiating attachment of the particle to the functionalized interior surface; (d) positioning at least two controllable electrodes in the microchannel which when energized facilitate release of the particle by subjecting the particle to a desired non-uniform electric field (nDEP); and (e) generating a desired non-uniform electric field (nDEP) in the microchannel; (f) wherein the controllable electrodes are connected to the means for generating an electric field.

7. A method according to any preceding embodiment, wherein the particle-attaching chemical species is a biological macromolecule having an affinity for the particle.

8. A method according to any preceding embodiment, wherein the attaching to and releasing from the particle-attaching chemical species are influenced by base concentration in the microchannel.

9. A method according to any preceding embodiment: (a) wherein the controllable electrodes are coated with an oxide layer; and (b) wherein the means for generating an electric field generates an nDEP force strong enough to break a molecular bond of at least approximately 400 pN.

10. A method according to any preceding embodiment, wherein a desired region of said microchannel is subjected to the nDEP thereby facilitating release of particles only from the desired region of the microchannel.

11. A microfluidic particle separation system utilizing nDEP techniques in which the particle is selectively attached to a specific surface and then selectively released, thereby facilitating separation, comprising: (a) a housing, said housing forming a microchannel having an interior surface; (b) a particle-attaching chemical species that functionalizes said interior surface; (c) at least two controllable electrodes, said electrodes coated with an oxide layer and positioned in the microchannel, which when energized facilitate release of a particle attached to the interior surface of the microchannel by subjecting the particle to a desired non-uniform electric field (nDEP); and (d) means for generating an electric field for subjecting the microchannel to the desired non-uniform electric field (nDEP); (e) wherein the controllable electrodes are connected to the means for generating an electric field.

12. A system according to any preceding embodiment, wherein the particle-attaching chemical species is a biological macromolecule having an affinity for the particle.

13. A system according to any preceding embodiment, wherein the attaching to and releasing from the particle-attaching chemical species are influenced by base concentration in the microchannel.

14. A system according to any preceding embodiment, wherein a nDEP force is generated strong enough to break a molecular bond of at least approximately 400 pN.

15. A system according to any preceding embodiment, wherein different regions of said microchannel are subjected to the desired electric field thereby facilitating release of particles only from the desired region of the microchannel.

16. A method for the separation and quantification of microfluidic particles utilizing nDEP techniques, the method comprising: (a) providing a substrate, the substrate having a microchannel, the microchannel adjacent to a plurality of electrodes; (b) connecting electrodes to a voltage source to generate nDEP force; (c) functionalizing an interior surface of the microchannel with a first particle-attaching chemical species; (d) introducing a first microfluid containing particles into the microchannel (e) moving the particles through the microchannel, wherein specific particles form a chemical bond with the first particle-attaching chemical species; (f) introducing a second microfluid containing beads into the microchannel, the beads functionalized with a second particle-attaching chemical species, (g) moving the second microfluid through the microchannel, (h) wherein the beads bind to the specific particles and are immobilized within the microchannel; and (i) wherein the specific particles are situated in between the functionalized interior surface of the microchannel and the functionalized surface of the beads; (j) generating a nDEP field from the electrodes; (k) introducing a third microfluid into the microchannel; (l) moving the third microfluid through the microchannel; (m) wherein the third microfluid has a flow rate and the nDEP field has a force whereby the flow rate and the nDEP force in combination are sufficient enough to break the chemical bond between either the first particle-attaching chemical species and the specific particle or between the second particle-attaching chemical species and the specific particle; and (n) wherein the beads detach and become mobilized within the interior of the microchannel; and (o) quantifying the beads that detach, wherein the number of beads that detach corresponds to the concentration of the specific particles within the microfluid.

17. A method for the separation and quantification of microfluidic particles utilizing nDEP techniques, the method comprising: (a) providing a substrate, the substrate having a microchannel, the microchannel adjacent to a plurality of electrodes; (b) connecting electrodes to a voltage source to generate nDEP force; (c) functionalizing an interior surface of the microchannel with a first particle-attaching chemical species; (d) introducing a first microfluid containing particles into the microchannel; (e) moving the particles through the microchannel, wherein specific particles form a chemical bond with the first particle-attaching chemical species; (f) introducing a second microfluid containing beads into the microchannel, said beads functionalized with a second particle-attaching chemical species, (g) moving the second microfluid through the microchannel, (h) wherein the beads bind to the specific particles and are immobilized within the microchannel; and (i) wherein the specific particles are situated in between the functionalized interior surface of the microchannel and the functionalized surface of the beads (j) introducing a third microfluid into the microchannel, the third microfluid having a base concentration which weakens the chemical bonds between the specific particle and the particle-attaching species on the interior surface of the microchannel and between the specific particle and the particle-attaching chemical species on the beads; (k) generating a nDEP field from said electrodes; (l) moving the third microfluid through the microchannel; (m) wherein the nDEP force applied to a weakened chemical bond is sufficient to break the bonds and detach the beads which become mobile within the interior of the microchannel; and (n) quantifying the beads that detach, wherein the number of beads that detach corresponds to the concentration of the specific particles within the microfluid.

18. A method for the separation and quantification of microfluidic particles utilizing nDEP techniques, the method comprising: (a) providing a substrate, the substrate having a microchannel, the microchannel adjacent to a plurality of electrodes; (b) depositing a layer of oxide in between the electrodes and the microchannel; (c) connecting electrodes to a voltage source to generate nDEP force; (d) functionalizing an interior surface of the microchannel with a first particle-attaching chemical species; (e) introducing a first microfluid containing particles into the microchannel; (f) moving the particles through the microchannel, wherein specific particles form a chemical bond with the first particle-attaching chemical species; (g) introducing a second microfluid containing beads into the microchannel, the beads functionalized with a second particle-attaching chemical species; (h) moving the second microfluid through the microchannel; (i) wherein the beads bind to the specific particles and are immobilized within the microchannel; and (j) wherein the specific particles are situated in between the functionalized interior surface of the microchannel and the functionalized surface of the beads; (k) generating a nDEP field from the electrodes; (l) wherein the oxide layer allows application of a voltage sufficient enough for nDEP to break the chemical bonds between the specific particle and the particle-attaching species on the interior surface of the microchannel and between the specific particle and the particle-attaching chemical species on the beads; and (m) wherein the beads become detached and mobile within the interior of the microchannel; (n) introducing a third microfluid into the microchannel; (o) moving the third microfluid through the microchannel; and (p) quantifying the beads that detach, wherein the number of beads that detach corresponds to the concentration of the specific particles within the microfluid.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:
1. A microfluidic separation method, comprising:
(a) providing a housing, said housing forming a microchannel having an interior surface;
(b) functionalizing said interior surface with a particle-attaching chemical species;
(c) contacting a particle with said functionalized interior surface, thereby initiating attachment of said particle to said functionalized interior surface, wherein the particle forms a molecular bond with the particle-attaching chemical species;
(d) positioning at least two controllable electrodes in the microchannel which when energized facilitate release of the particle by subjecting the particle to a non-uniform electric field; and
(e) generating the non-uniform electric field in said microchannel to break the molecular bond between the particle and the particle-attaching chemical species and release the particle from said functionalized interior surface,
wherein the at least two controllable electrodes are connected to a voltage source.

2. The microfluidic separation method according to claim 1, wherein said particle-attaching chemical species is a biological macromolecule having an affinity for the particle.

3. The microfluidic separation method according to claim 1, wherein said attaching to and releasing from said particle-attaching chemical species are influenced by a base concentration in the microchannel.

4. The microfluidic separation method according to claim 1:
wherein said at least two controllable electrodes are coated with an oxide layer; and
wherein the voltage source generates a negative dielectrophoresis force strong enough to break the molecular bond of at least approximately 400 pN.

5. The microfluidic separation method according to claim 4, wherein a desired region of said microchannel is subjected to said negative dielectrophoresis force, thereby facilitating release of particles selectively from said desired region of the microchannel.

6. A microfluidic separation and quantification method, the method comprising:
(a) providing a substrate, the substrate having a microchannel, the microchannel adjacent to a plurality of electrodes;
(b) connecting the plurality of electrodes to a voltage source to generate a negative dielectrophoresis field;
(c) functionalizing an interior surface of the microchannel with a first particle-attaching chemical species;
(d) introducing a first microfluid containing particles into the microchannel;
(e) moving the particles through the microchannel, wherein specific particles form a first chemical bond with the first particle-attaching chemical species;
(f) introducing a second microfluid containing beads into the microchannel, said beads functionalized with a second particle-attaching chemical species;
(g) moving the second microfluid through the microchannel, wherein the beads bind to the specific particles via a second chemical bond and are immobilized within the microchannel, and wherein the specific particles are situated in between the functionalized interior surface of the microchannel and the functionalized surface of the beads;
(h) generating the negative dielectrophoresis field from said plurality of electrodes;
(i) introducing a third microfluid into the microchannel;
(j) moving the third microfluid through the microchannel, wherein the third microfluid has a flow rate and the negative dielectrophoresis field has a force whereby the flow rate and the force in combination are sufficient enough to break the first chemical bond between either the first particle-attaching chemical species and the specific particles or the second chemical bond between the second particle-attaching chemical species and the specific particles, wherein the beads detach and become mobilized within the interior of the microchannel; and (k) quantifying the beads that detach, wherein the number of beads that detach corresponds to a concentration of the specific particles within the first microfluid.

7. A microfluidic separation and quantification method, the method comprising:
(a) providing a substrate, the substrate having a microchannel, the microchannel adjacent to a plurality of electrodes;
(b) connecting the plurality of electrodes to a voltage source to generate a negative dielectrophoresis field;
(c) functionalizing an interior surface of the microchannel with a first particle-attaching chemical species;
(d) introducing a first microfluid containing particles into the microchannel;
(e) moving the particles through the microchannel, wherein specific particles form a first chemical bond with the first particle-attaching chemical species;
(f) introducing a second microfluid containing beads into the microchannel, said beads functionalized with a second particle-attaching chemical species;
(g) moving the second microfluid through the microchannel, wherein the beads bind to the specific particles via a second chemical bond and are immobilized within the microchannel, and wherein the specific particles are situated in between the functionalized interior surface of the microchannel and the functionalized surface of the beads;
(h) introducing a third microfluid into the microchannel, the third microfluid having a base concentration which weakens the first chemical bond between the specific particles and the first particle-attaching species on the interior surface of the microchannel and the second chemical bond between the specific particles and the second particle-attaching chemical species on the beads;
(i) generating the negative dielectrophoresis field from said plurality of electrodes;
(j) moving the third microfluid through the microchannel, wherein the negative dielectrophoresis field has a force applied to a weakened chemical bond that is sufficient to break said weakened chemical bond and detach the beads which become mobile within the interior of the microchannel; and
(k) quantifying the beads that detach, wherein the number of beads that detach corresponds to a concentration of the specific particles within the first microfluid.

8. A microfluidic separation and quantification method, the method comprising:
(a) providing a substrate, the substrate having a microchannel, the microchannel adjacent to a plurality of electrodes;
(b) depositing a layer of oxide in between the plurality of electrodes and the microchannel;
(c) connecting the plurality of electrodes to a voltage source to generate a negative dielectrophoresis field;
(d) functionalizing an interior surface of the microchannel with a first particle-attaching chemical species;
(e) introducing a first microfluid containing particles into the microchannel;
(f) moving the particles through the microchannel, wherein specific particles form a first chemical bond with the first particle-attaching chemical species;
(g) introducing a second microfluid containing beads into the microchannel, said beads functionalized with a second particle-attaching chemical species;
(h) moving the second microfluid through the microchannel, wherein the beads bind to the specific particles via a second chemical bond and are immobilized within the microchannel, and wherein the specific particles are situated in between the functionalized interior surface of the microchannel and the functionalized surface of the beads;
(i) generating the negative dielectrophoresis field from said plurality of electrodes, wherein the oxide layer allows application of a voltage sufficient enough for the negative dielectrophoresis field to break the first chemical bond between the specific particles and the first particle-attaching species on the interior surface of the microchannel and the second chemical bond between the specific particles and the second particle-attaching chemical species on the beads, and wherein the beads become detached and mobile within the interior of the microchannel;
(j) introducing a third microfluid into the microchannel;
(k) moving the third microfluid through the microchannel; and
(l) quantifying the beads that detach, wherein the number of beads that detach corresponds to a concentration of the specific particles within the first microfluid.

* * * * *